(12) United States Patent
Lakshmanan et al.

(10) Patent No.: US 6,453,451 B1
(45) Date of Patent: Sep. 17, 2002

(54) GENERATING STANDARD DELAY FORMAT FILES WITH CONDITIONAL PATH DELAY FOR DESIGNING INTEGRATED CIRCUITS

(75) Inventors: Viswanathan Lakshmanan, Westminster, CO (US); Kenton Dalton, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/880,607

(22) Filed: Jun. 12, 2001

Related U.S. Application Data

(60) Provisional application No. 60/237,737.

(51) Int. Cl.[7] ............................................. G06F 17/50
(52) U.S. Cl. ............................. 716/6; 716/17; 716/18
(58) Field of Search ................................. 716/6, 17, 18

(56) References Cited

U.S. PATENT DOCUMENTS 5,754,826 A * 5/1998 Gamal et al. ................ 716/19
5,886,900 A * 3/1999 Gascoyne et al. ............. 716/6
5,991,523 A * 11/1999 Williams et al. ............. 716/18
6,185,726 B1 * 2/2001 Chou .......................... 716/18
6,189,131 B1 * 2/2001 Graef et al .................. 716/18
6,304,998 B1 * 10/2001 Kamiya et al. ................ 716/6
6,405,356 B1 * 6/2002 Yang .......................... 716/17

* cited by examiner

*Primary Examiner*—Trong Phan
(74) *Attorney, Agent, or Firm*—Fitch, Even, Tabin & Flannery

(57) ABSTRACT

A method of generating a back-annotated standard delay format file for designing integrated circuits with conditional/moded delays is disclosed that includes the steps of receiving as inputs a main input file, a conditional delay specifications file, and a selected option switch; inserting delay information from the conditional delay specifications file for each cell entry in the main input file according to the selected option switch into an output data structure; and generating the back-annotated standard delay format file from the output data structure.

14 Claims, 10 Drawing Sheets

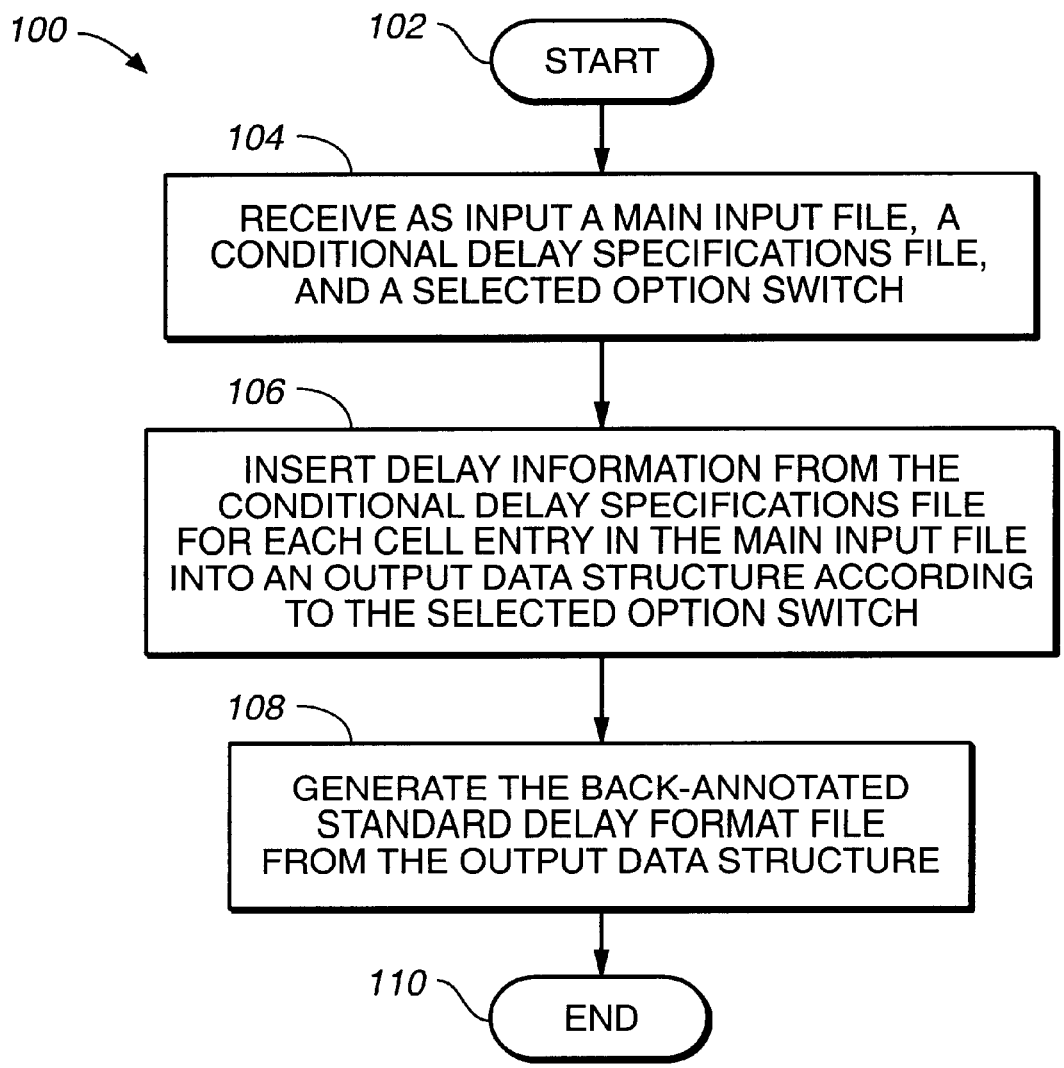
FIG._1

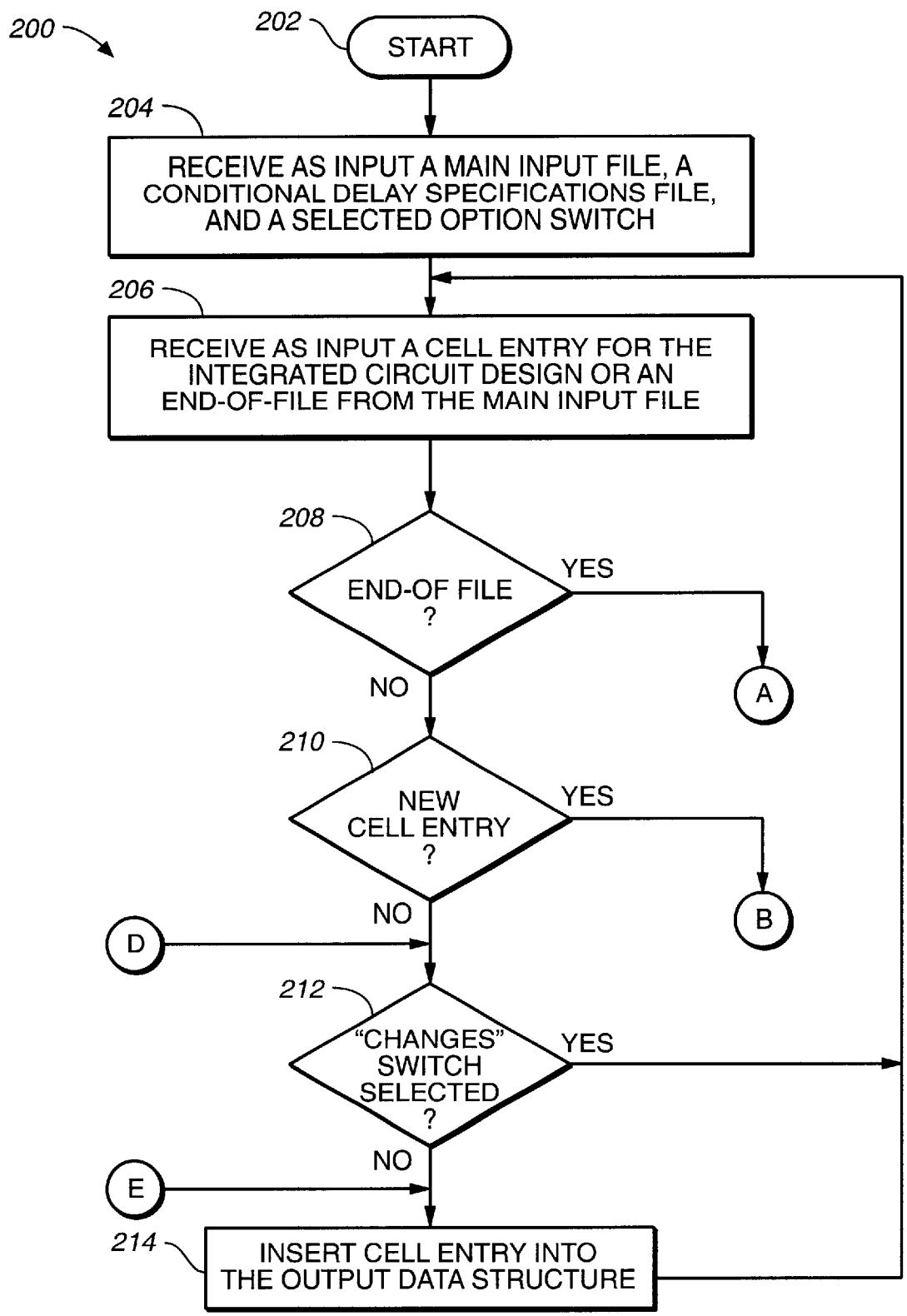
FIG._2A

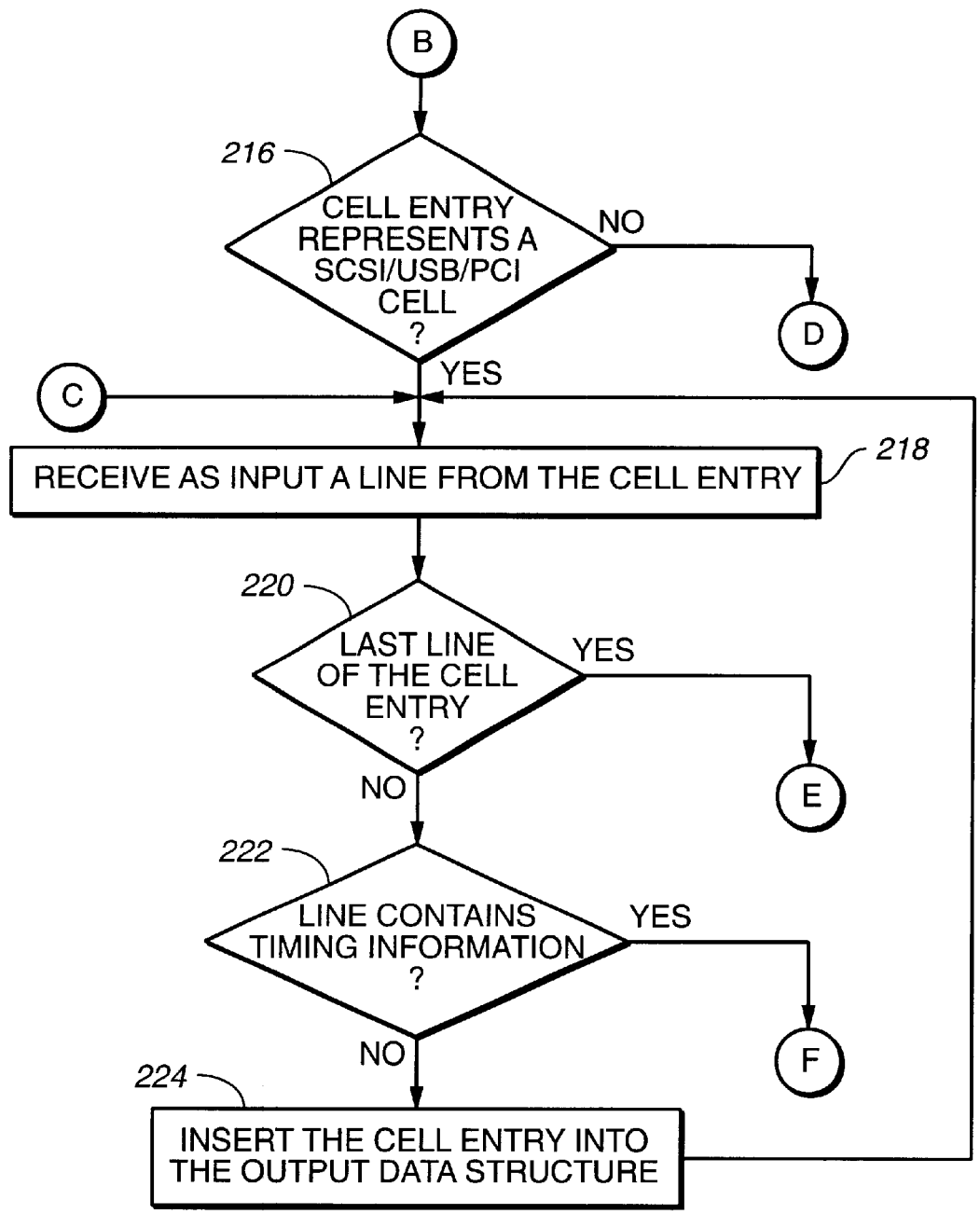
FIG._2B

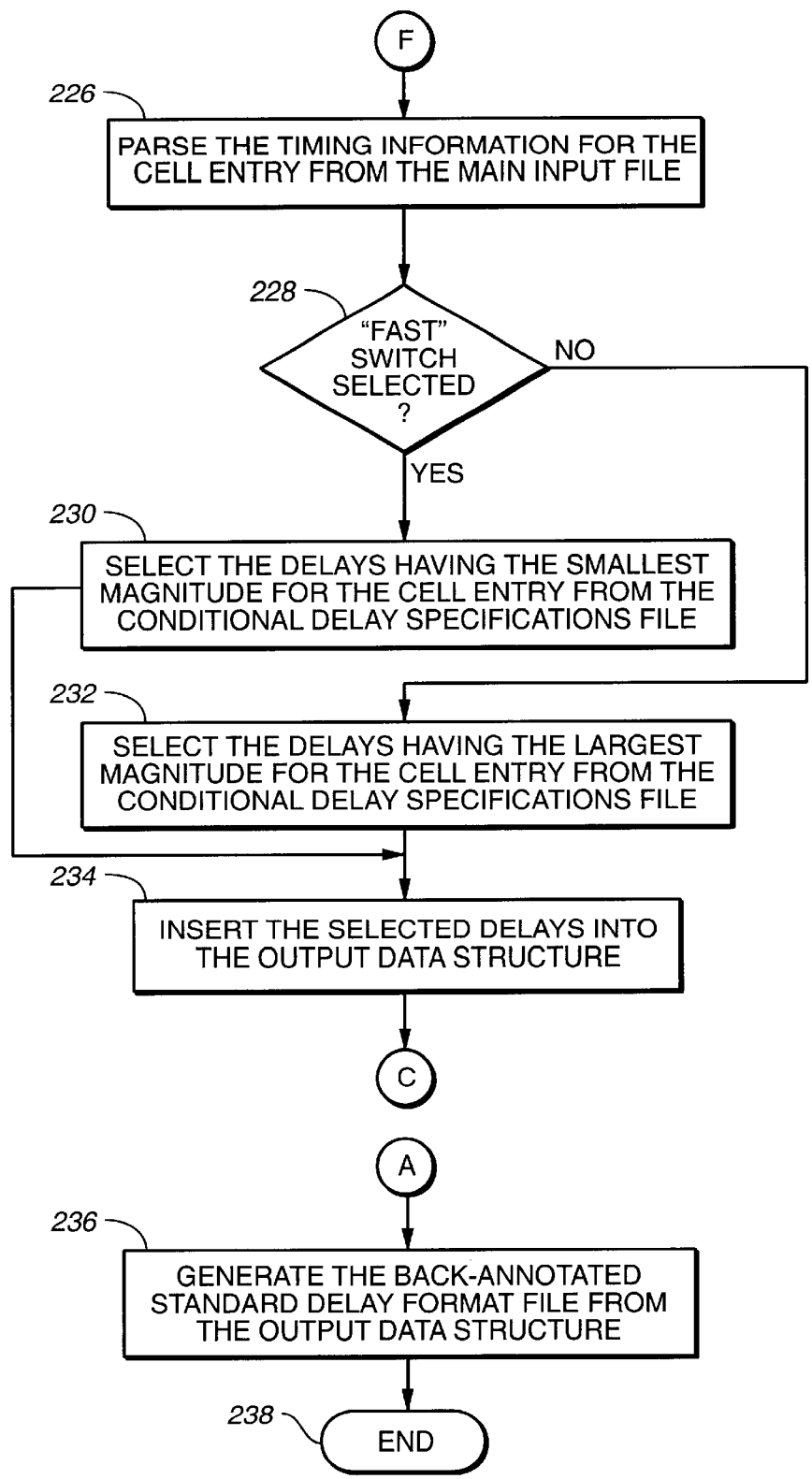
FIG._2C

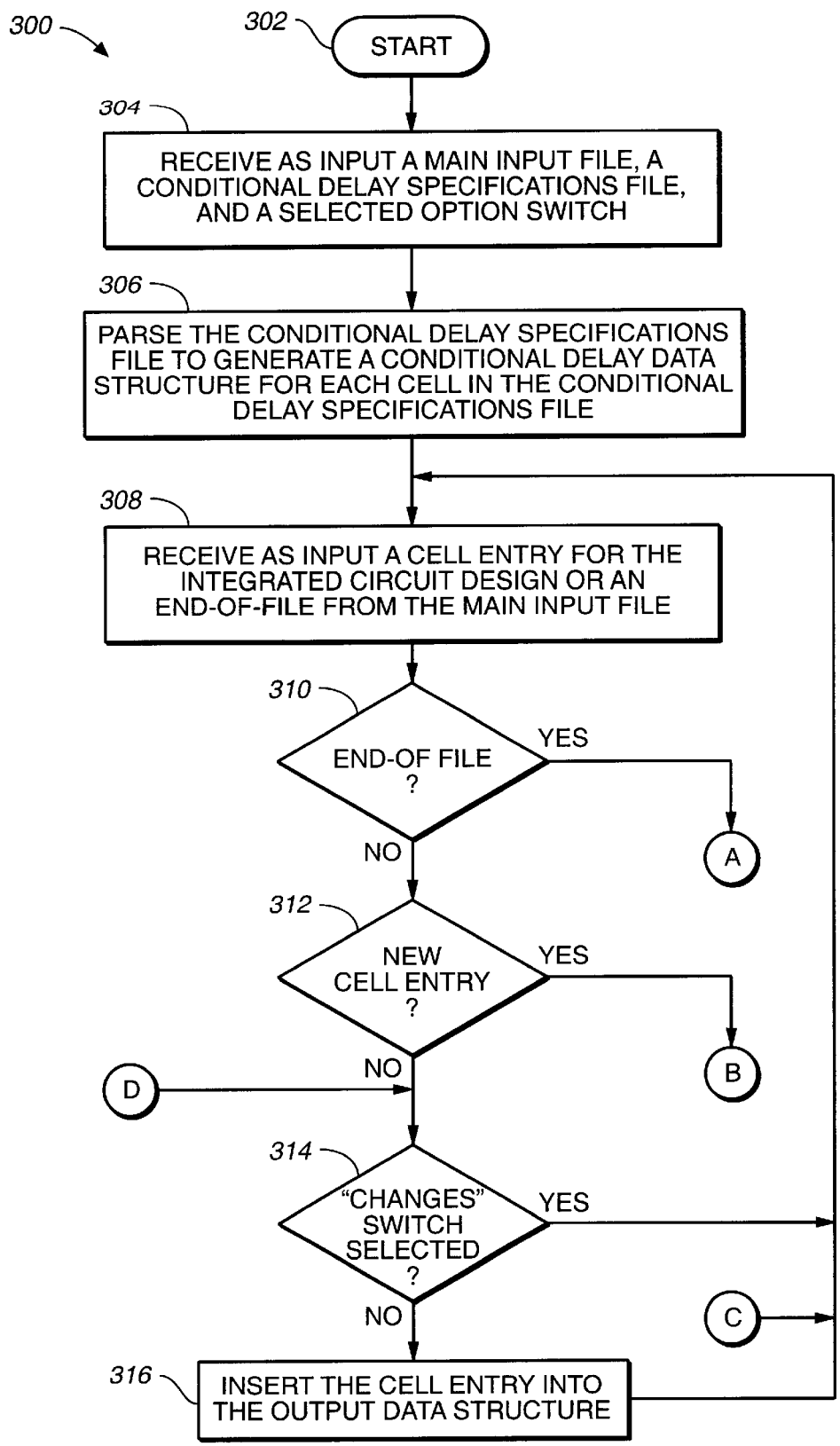
FIG._3A

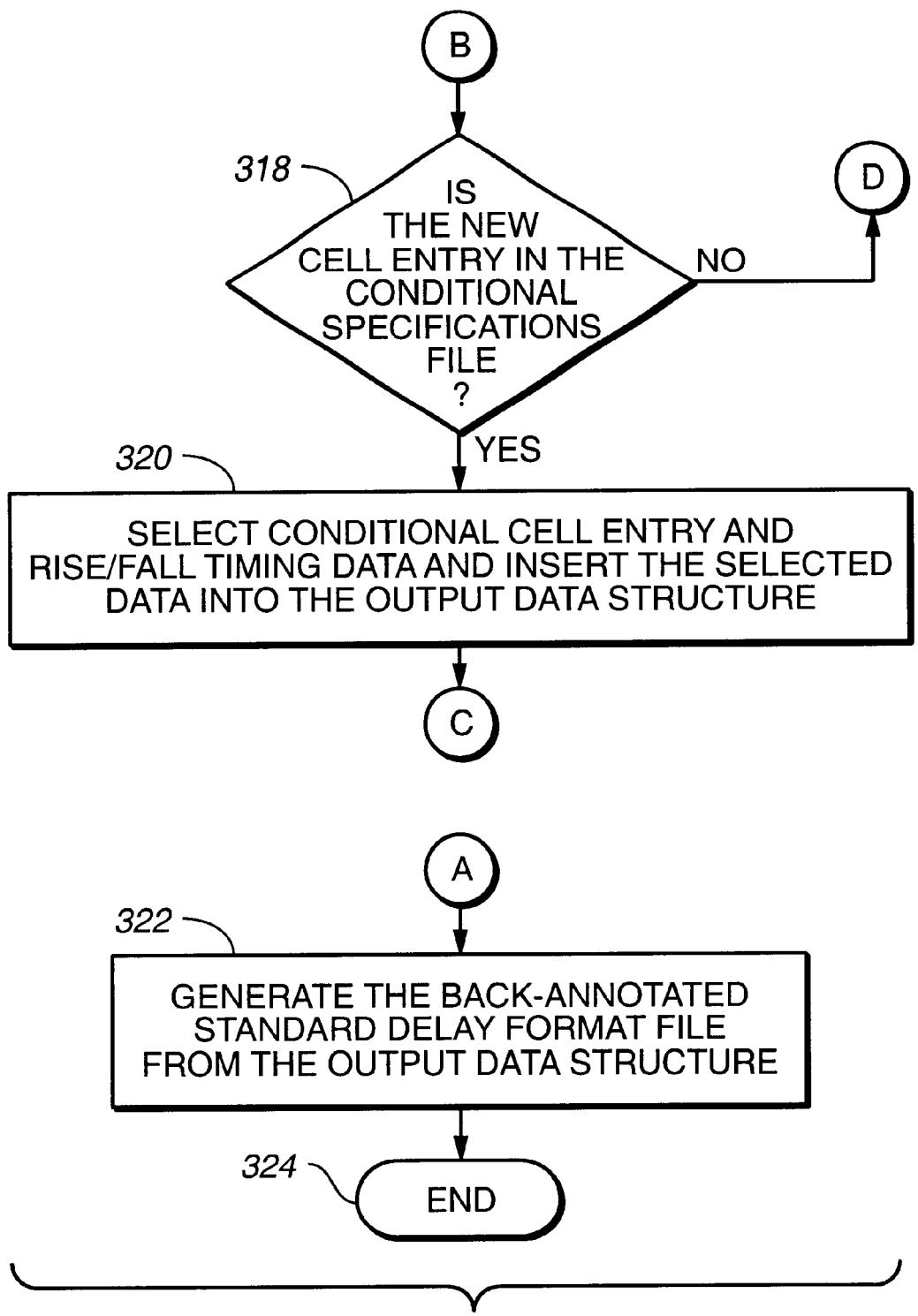
FIG._3B

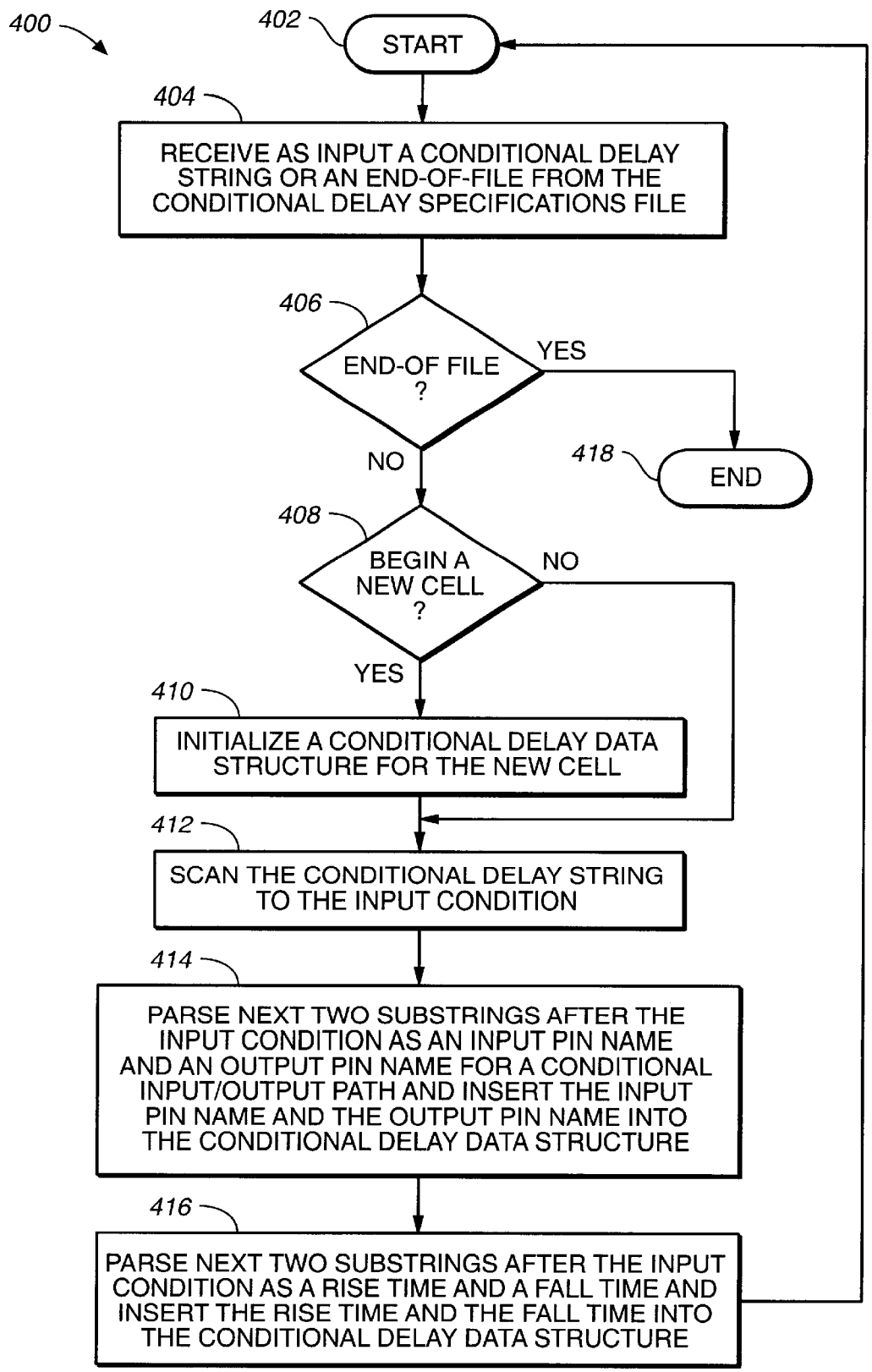
FIG._4

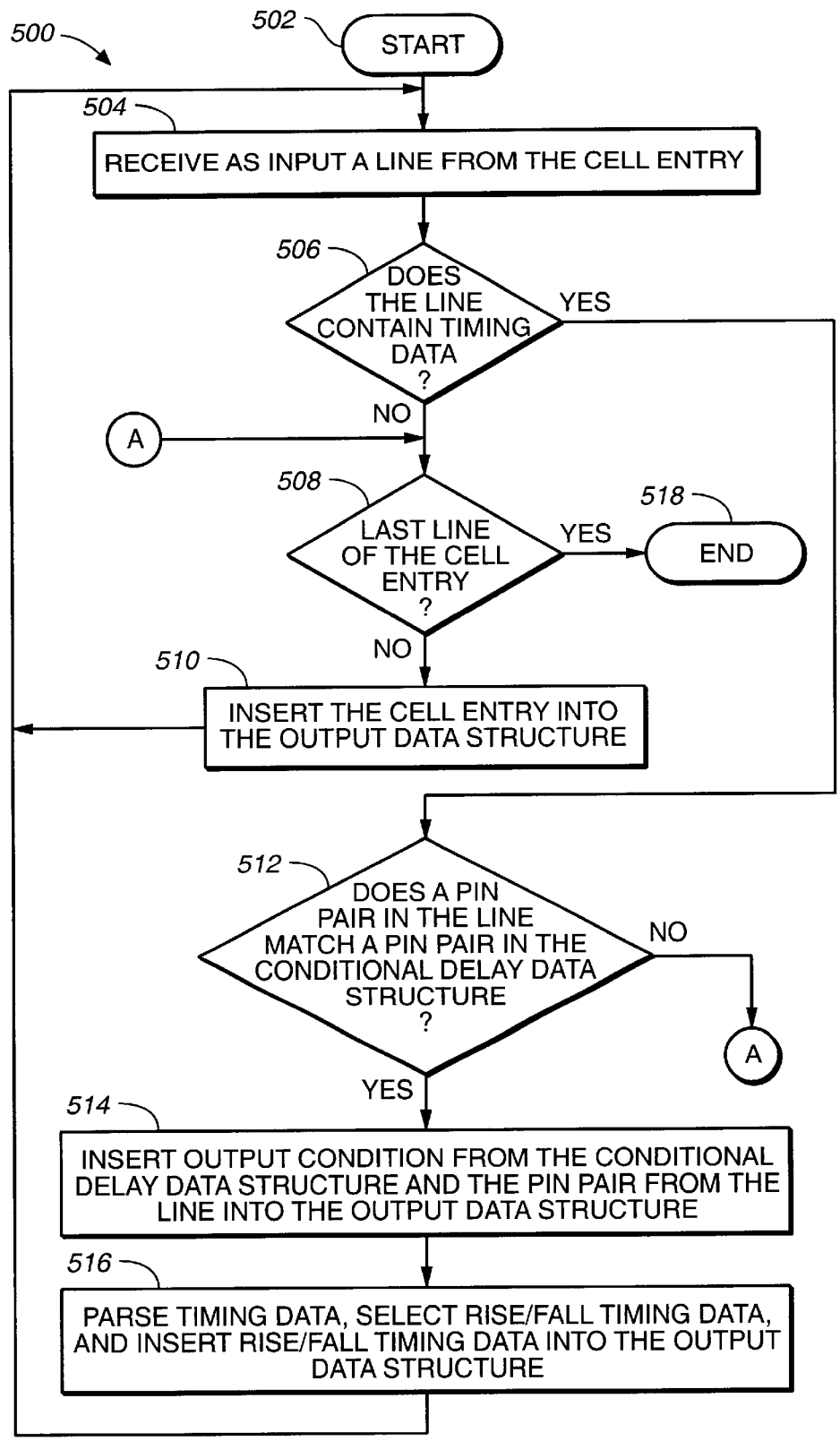
FIG._5

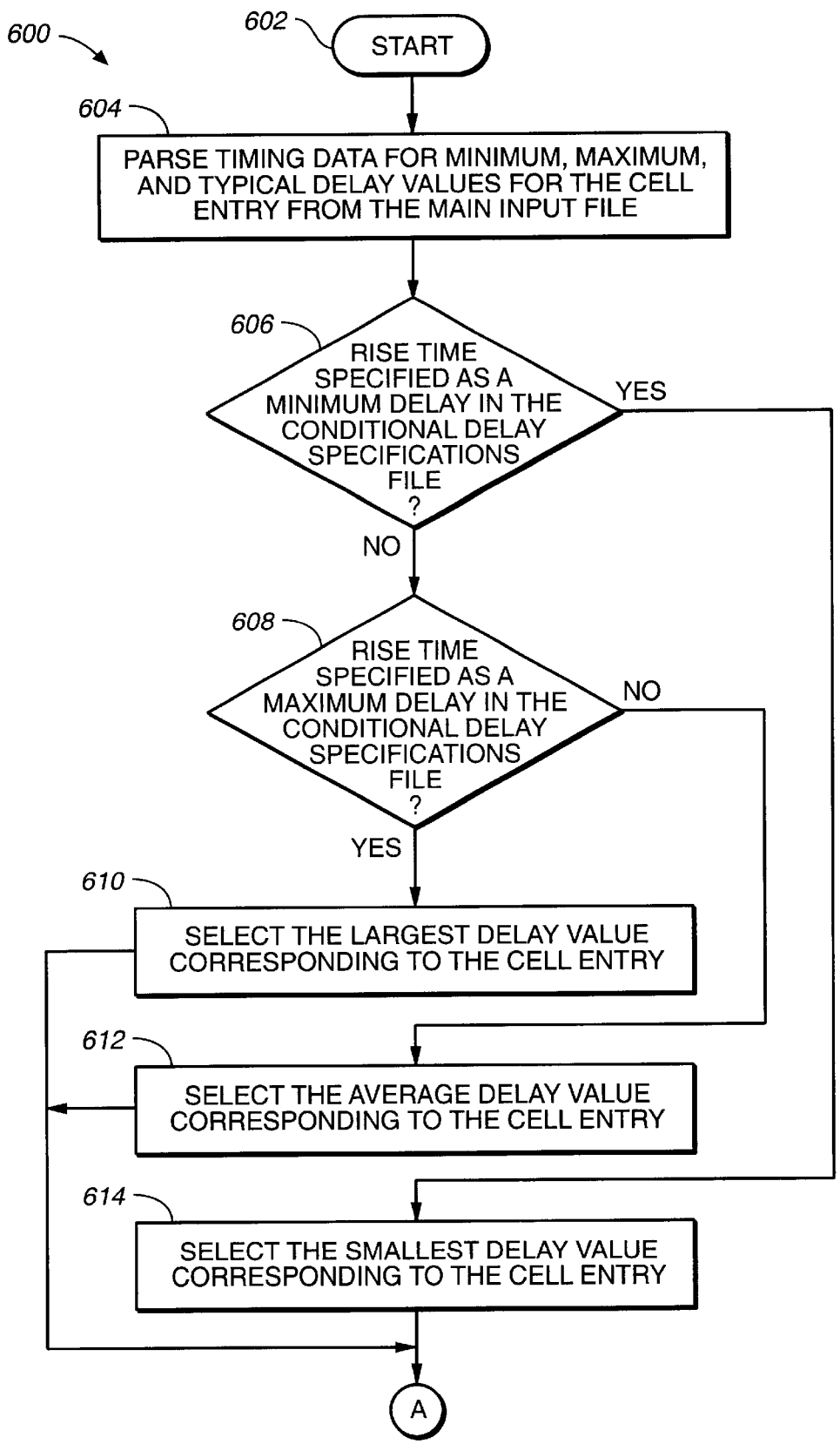
FIG._6A

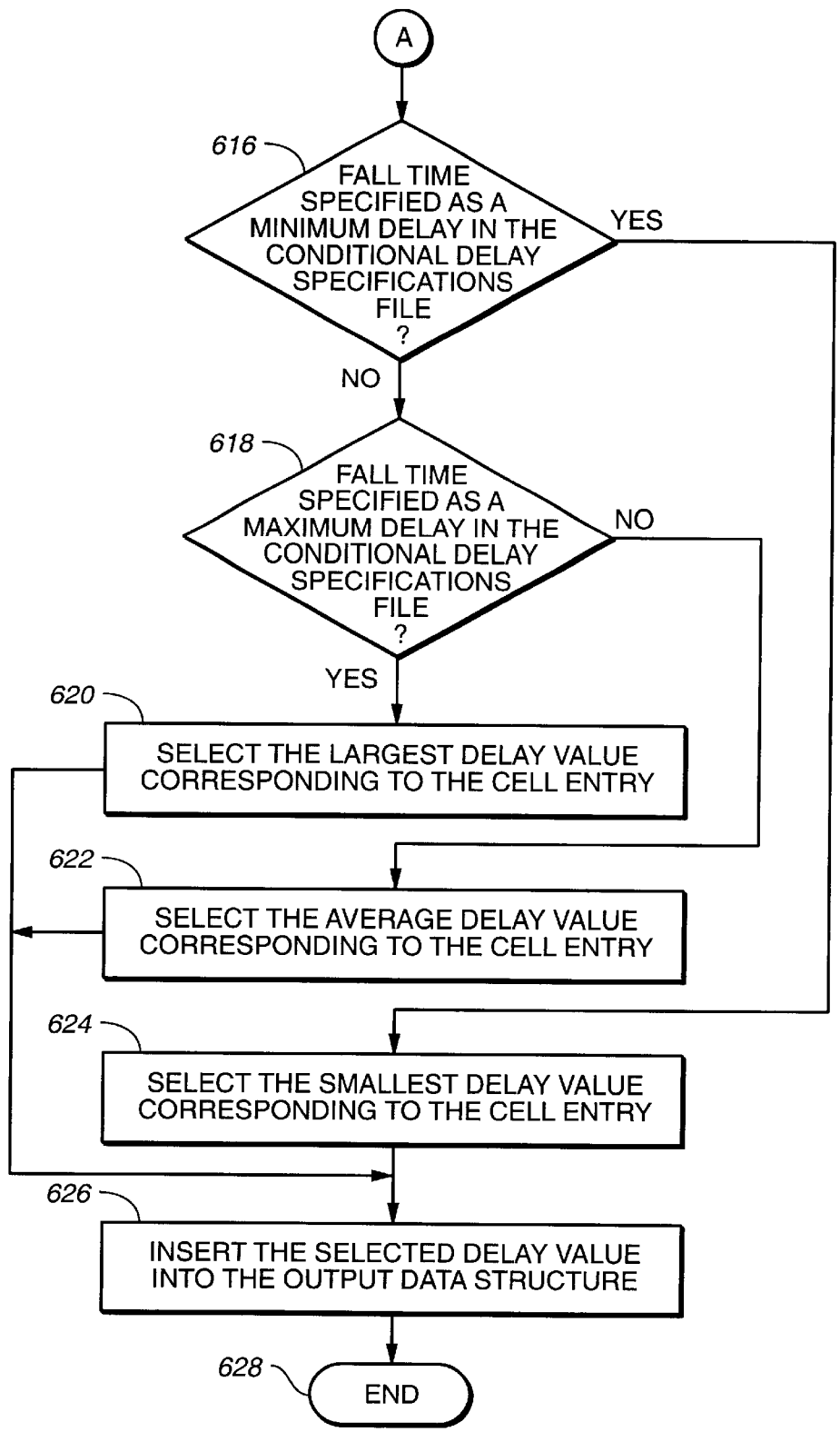
FIG._6B

GENERATING STANDARD DELAY FORMAT FILES WITH CONDITIONAL PATH DELAY FOR DESIGNING INTEGRATED CIRCUITS

CROSS-REFERENCE TO RELATED APPLICATIONS

This application claims priority under 35 USC §119(e) to U.S. Provisional Patent Application Serial No. 60/237,737 of Viswanathan Lakshmanan et al. for CONDITIONAL PATH DELAY SDF GENERATION, filed Oct. 2, 2000, incorporated herein by reference as if set forth in its entirety.

BACKGROUND OF THE INVENTION

The present invention relates generally to electronic circuit design using computer simulation techniques. More specifically, but without limitation thereto, the present invention relates to back-annotating Standard Delay Format files used by logic design tools to simulate a variety of operating conditions for an integrated circuit design.

In previous methods for modeling delays in an integrated circuit design, software tools for generating delays include an IOPATH delay parameter which may be globally back-annotated by the system designer for the best case, the typical case, and the worst case delay values. For a conditional path delay, or a moded delay path, the back-annotated value depends on the mode in which the design is being simulated. Based on the mode, the values for the best case delays or the worst case delays have to be manually back-annotated, which may be an extremely time-consuming and error-prone process.

SUMMARY OF THE INVENTION

The present invention advantageously addresses the needs above as well as other needs by providing a method of generating back-annotated Standard Delay Format (SDF) files for use by logic design tools in simulating the operation of an integrated circuit design under a variety of operating conditions with conditional/moded delays.

In one embodiment, the invention may be characterized as a method of generating a back-annotated Standard Delay Format file for designing integrated circuits that includes the steps of receiving as inputs a main input file, a conditional delay specifications file, and a selected option switch; inserting delay information from the conditional delay specifications file for each cell entry in the main input file according to the selected option switch into an output data structure; and generating the back-annotated Standard Delay Format file from the output data structure.

In another embodiment, the invention may be characterized as a computer program product that includes a medium for embodying a computer program for input to a computer and a computer program embodied in the medium for causing the computer to perform the following functions: receiving as inputs a main input file, a conditional delay specifications file, and a selected option switch; inserting delay information from the conditional delay specifications file for each cell entry in the main input file according to the selected option switch into an output data structure; and generating the back-annotated Standard Delay Format file from the output data structure.

The features and advantages summarized above in addition to other aspects of the present invention will become more apparent from the description, presented in conjunction with the following drawings and Appendix.

BRIEF DESCRIPTION OF THE DRAWINGS

FIG. 1 is a flowchart illustrating a method of the present invention for generating a back-annotated Standard Delay Format file for designing integrated circuits according to an embodiment of the present invention;

FIGS. 2A, 2B, and 3C are a detailed flowchart of the steps performed by the method of the present invention illustrated in the flowchart of FIG. 1;

FIGS. 3A and 3B are a flowchart illustrating a method of generating a back-annotated Standard Delay Format file for designing integrated circuits according to another embodiment of the present invention that allows the user to specify conditional delay paths and to mix and match rise/fall delay times;

FIG. 4 is a flowchart illustrating a method of parsing the conditional delay specifications file to generate a conditional delay data structure for the flowchart of FIGS. 3A and 3B;

FIG. 5 is a flowchart illustrating a method of selecting a conditional cell entry and rise/fall data from the conditional delay data structure and inserting the conditional cell entry and the rise/fall data into the output data structure for the flowchart of FIGS. 3A and 3B; and FIGS. 6A and 6B are a flowchart illustrating a method of parsing timing data, selecting rise/fall timing data, and inserting the rise/fall timing data into the output data structure for the flowchart of FIG. 5.

Appendix A contains examples of computer program listings for the method illustrated by the flowcharts in the accompanying figures.

DETAILED DESCRIPTION OF THE EMBODIMENTS

One of the difficulties encountered in the design of a complex integrated circuit is the modeling of the delay of each net to simulate how the integrated circuit will perform to detect and correct problems before committing to a hardware layout. A number of logic design tools are available for simulating the operation of an integrated circuit design from a main input file that describes each cell in the integrated circuit design. To simplify the interface with different logic design tools, a Standard Delay Format file is generally used as the main input file.

FIG. 1 is a flowchart 100 illustrating a method of the present invention for generating a back-annotated Standard Delay Format file for designing integrated circuits according to an embodiment of the present invention.

Step 102 is the entry point for the flowchart 100.

In step 104, a main input file, a conditional delay specifications file, and a selected option switch are received as input.

In step 106, delay information from the conditional delay specifications file for each cell entry in the main input file is inserted into an output data structure according to the selected option switch.

In step 108, the back-annotated standard delay format file is generated from the output data structure.

Step 110 is the exit point for the flowchart 100.

The method illustrated by the flowchart 100 may be implemented according to well known techniques from the detailed examples below.

FIGS. 2A, 2B, and 2c are a detailed flowchart 200 of the steps performed by the method of the present invention illustrated in the flowchart 100 of FIG. 1.

In the main input file, the minimum, maximum, and average cell delays are defined for each cell in the integrated circuit design. The conditional delay specifications file allows the user to define the RISE and fall times for fast, slow, or average (based on operating conditions defined for the specific cell technology) using the keywords MIN, TYP, or MAX, corresponding to FAST, AVERAGE, or SLOW delay values, respectively. The selected option switch may be, for example, a "fast" switch, a "slow" switch, a "changes" switch, or a "complete" switch. The "fast" switch results in a back-annotated Standard Delay Format file having the fast rise and fall times, the "slow" switch results in a back-annotated Standard Delay Format file having the slow rise and fall times, the "changes" switch results in a back-annotated Standard Delay Format file that only includes updated timing information, and the "complete" switch results in a back-annotated Standard Delay Format file that includes updated timing information and header information. Other option switches for generating back-annotated Standard Delay Format files may be used to suit specific applications within the scope of the present invention.

Step 202 is the entry point for the flowchart 200.

In step 204, a main input file, a conditional delay specifications file, and a selected option switch are received as input.

In step 206, a cell entry for the integrated circuit design or an end-of-file is received as input from the main input file.

In step 208, if the cell entry is an end-of-file, then continue from step 236, otherwise processing is continued from step 210.

In step 210, if the cell entry introduces a new cell, then continue from step 216, otherwise processing is continued from step 212.

In step 212, if the selected option switch is the "changes" switch, then processing is continued from step 206, otherwise processing is continued from step 214.

In step 214, the cell entry is inserted into the output data structure and processing is continued from step 206. The cell entry is preferably inserted verbatim, however other formats may be used to suit specific applications within the scope of the present invention as may become apparent to practitioners of the art.

In step 216, if the cell entry represents a Small Computer Standard Interface (SCSI) cell, a Universal Serial Bus (USB) cell, or a Peripheral Component Interconnect (PCI) cell, then processing is continued from step 218, otherwise processing is continued from step 212.

In step 218, a line from the cell entry is received as input.

In step 220, if the line from the cell entry is the last line of the cell entry, then processing is continued from step 214, otherwise processing is continued from step 222.

In step 222, if the line from the cell entry contains timing information, then processing is continued from step 226, otherwise processing is continued from step 224.

In step 224, the cell entry is inserted into the output data structure and processing is continued from step 218.

In step 226, the timing information for the cell entry is parsed from the main input file.

In step 228, if the selected option switch is the "fast" switch, then processing is continued from step 230, otherwise processing is continued from step 232.

In step 230, the delays having the smallest magnitude for the cell entry from the conditional delay specifications file are selected, and processing is continued from step 234.

In step 232, the delays having the largest magnitude for the cell entry are selected from the conditional delay specifications file.

In step 234, the selected delays are inserted into the output data structure, and processing is continued from step 218.

In step 236, the back-annotated standard delay format file is generated from the output data structure.

Step 238 is the exit point for the flowchart 100.

FIGS. 3A and 3B are a flowchart 300 illustrating a method of generating a back-annotated Standard Delay Format file for designing integrated circuits according to a further embodiment of the present invention that allows the user to specify conditional delay paths for all cells in the conditional delay specifications file and to mix and match RISE/FALL delay times. Based on the user's knowledge of the operation of the integrated circuit, the user may use the mix and match feature to select the RISE/FALL times for any IOPATH as being MIN, TYP, or MAX, corresponding to FAST, AVERAGE, or SLOW delay values as the user deems appropriate. For example, the user may choose MIN for both the RISE and the FALL times or TYP MIN wherein TYP applies to the RISE delay value and MIN applies to the FALL delay value. Any possible combination of MIN/TYP/MAX is allowed, and the mix and match feature is intended to be applied in conjunction with a thorough understanding of the integrated circuit behavior.

Step 302 is the entry point for the flowchart 300.

In step 304, a main input file, a conditional delay specifications file, and a selected option switch are received as input.

In step 306, the conditional delay specifications file is parsed to generate a conditional delay data structure for each cell in the conditional delay specifications file.

In step 308, a cell entry for the integrated circuit design is received as input from the main input file.

In step 310, if the cell entry is an end-of-file, then processing is continued from step 322, otherwise processing is continued from step 312.

In step 312, if the cell entry introduces a new cell, then processing is continued from step 318, otherwise processing is continued from step 314.

In step 314, if the selected option switch is the "changes" switch, then processing is continued from step 308, otherwise processing is continued from step 316;

In step 316, the cell entry is inserted into the output data structure and processing is continued from step 308. The cell entry is preferably inserted verbatim, however other formats may be used to suit specific applications as may become apparent to practitioners of the art.

In step 318, if the new cell entry has a name identical to that of a cell entry in the conditional delay specifications file, then processing continues from step 320, otherwise processing is continued from step 314.

In step 320, the cell entry and selected rise/fall data from the conditional delay data structure are inserted into the output data structure, and processing is continued from step 308.

Step 324 is the exit point for the flowchart 300.

FIG. 4 is a flowchart 400 illustrating a method of parsing the conditional delay specifications file to generate a conditional delay data structure for each cell listed in the conditional delay specifications file for step 306 of the flowchart 300.

Step 402 is the entry point for the flowchart 400.

In step 404, a conditional delay string or an end-of-file is received as input from the conditional delay specifications file.

In step 406, if an end-of-file is received, then processing is continued from step 418, otherwise processing is continued from step 408.

In step 408, if the conditional delay string begins a new cell, then processing is continued at step 410, otherwise processing is continued from step 412.

In step 410, a new conditional delay data structure is initialized for the new cell, and processing is continued from step 414.

In step 412, the conditional delay string is scanned to an input condition symbol, and the input condition symbol is inserted into the conditional delay data structure.

In step 414, the next two substrings after the input condition symbol are parsed respectively as an input pin name and an output pin name for a conditional input/output path. The input pin name and an output pin name are inserted into the conditional delay data structure.

In step 416, the next two substrings in the conditional delay string are parsed respectively as a rise time and a fall time. The rise time and the fall time are inserted into the new conditional delay data structure, and processing is continued from step 404.

Step 418 is the exit point for the flowchart 400.

FIG. 5 is a flowchart 500 illustrating a method of inserting a conditional cell entry and selected rise/fall data from the conditional delay data structure into the output data structure for step 320 of the flowchart 300.

Step 502 is the entry point of the flowchart 500.

In step 504, a line from the cell entry is received as input.

In step 506, if the line from the cell entry contains timing information, then processing is continued from step 512, otherwise processing is continued from step 508.

In step 508, if the line from the cell entry is the last line of the cell entry, then processing is continued from step 518, otherwise processing is continued from step 510.

In step 510, the cell entry is inserted into the output data structure and processing is continued from step 504.

In step 512, if a pin pair from the line from the cell entry is identical to a pin pair in the conditional delay data structure, then processing is continued from step 514, otherwise processing is continued from step 508.

In step 514, the output condition from the conditional delay data structure and the corresponding pin pair from the line from the cell entry are inserted into the output data structure.

In step 516, timing data for minimum, maximum, and typical delay values are parsed from the main input file for the cell entry. Rise/fall timing data are selected for the cell entry, and the selected rise/fall timing data are inserted into the output data structure.

Step 518 is the exit point for the flowchart 400.

FIGS. 6A and 6B are a flowchart 600 illustrating a method of parsing timing data, selecting rise/fall timing data, and inserting the rise/fall timing data into the output data structure for step 516 of the flowchart 500 in FIG. 5.

Step 602 is the entry point for the flowchart 600.

In step 604, timing data for minimum, maximum, and typical delay values for the cell entry are parsed from the main input file.

In step 606, if a rise time is specified in the conditional delay specifications file as a minimum delay, then processing is continued from step 614, otherwise processing is continued from step 608.

In step 608, if the rise time is specified in the conditional delay specifications file as a maximum delay, then processing is continued from step 610, otherwise processing is continued from step 612.

In step 610, the largest delay time corresponding to the cell entry is selected from the main input file, and processing is continued from step 616.

In step 612, the average delay time corresponding to the cell entry is selected from the main input file, and processing is continued from step 616.

In step 614, the smallest delay time corresponding to the cell entry is selected from the main input file.

In step 616, if a fall time is specified in the conditional delay specifications file as a minimum delay, then processing is continued from step 624, otherwise processing is continued from step 618.

In step 618, if the fall time is specified in the conditional delay specifications file as a maximum delay, then processing is continued from step 620, otherwise processing is continued from step 622.

In step 620, the largest delay time corresponding to the cell entry is selected from the main input file, and processing is continued from step 626.

In step 622, the average delay time corresponding to the cell entry is selected from the main input file, and processing is continued from step 626.

In step 624, the smallest delay time corresponding to the cell entry is selected from the main input file.

In step 626, the selected delay time is inserted into the output data structure.

Step 628 is the exit point for the flowchart 600.

The methods described above exemplify how a back-annotated Standard Delay Format file may be generated automatically according to a selected option switch for input to a wide selection of logic design tools to facilitate integrated circuit design.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The methods illustrated in the flowchart descriptions above may be embodied in a computer program product and implemented by a computer according to well known programming techniques to perform the following functions: receiving as inputs a main input file, a conditional delay specifications file, and a selected option switch; inserting delay information from the conditional delay specifications file for each cell entry in the main input file according to the selected option switch into an output data structure; and generating the back-annotated standard delay format file from the output data structure. The computer program product may also include modifications to the method described above, such as support for multiple-valued IOPATHs in the main input file and a check to ensure that the main input file is not processed more than once by the computer program.

The computer program described above may be, for example, a Practical Extraction and Report Language (PERL) script, however, other programming languages may be used to implement the embodiments of the present invention described above to suit specific applications. An example of a PERL script, a conditional delay specifications file, a main input file, and Standard Delay Format files generated by the PERL script are given in Appendix A.

APPENDIX A

Program Listings:

"sdf_munge" - PERL script of a method according to an embodiment of the present invention "munge.list" - Side file created by the user for testing the PERL script "scsiulvdls33.sdf" - input SDF file used to test the PERL script "scsiulvdls33.newsdf" - output file generated by the PERL script at 11:46:22 using the "changes" switch "scsiulvdls33.newsdf" - output file generated by the PERL script at 11:47:04 using the "changes" and "complete" switches sdf_munge

```perl
#!/usr/local/gnu/bin/perl5

#########################################################################
# This script reads in a SDF file and creates slow/ fast delay mode     #
# SDF files.                                                            #
#                                                                       #
# Author       : Kent Dalton and Viswanathan Lakshmanan                 #
# Creation date : 1st September 99                                      #
#                                                                       #
# Usage sdf_munge -<stdout/changes/complete> <design.sdf>               #
#########################################################################
$VERSION = "2.0.0";

$MUNGE_FILE = "./munge.list";

$stdout = 0;
$time_value = 0;
$ThisCellIsSpecial = 0;
$PrintOnlyChanged = 0;
$IncludeHeader = 0;
$InHeader = 1;
$min = 0;
$max = 0;
$typ = 0;

Permissible options foreach $file ( @ARGV ) {
    if( $file =~ /^-stdout/ ) {
        $stdout = 1;
    }
    elsif( $file =~ /^-complete/ ) {
        $IncludeHeader = 1;
        $PrintOnlyChanged = 1;
    }
    elsif( $file =~ /^-changes/ ) {
        $PrintOnlyChanged = 1;
    }
    elsif( $file =~ /^-/) {
        &usage;
    }
    else {
        push (@files,$file);
    }
}

# Read the munge.list
open(MFILE, "<$MUNGE_FILE") || die("Can't open $MUNGE_FILE\n");

$TotalFlavors = 0;

while(<MFILE>) {
    if(/CELLTYPE\s+?(.*)/) {

Keeps count of every cell being modified $TotalFlavors++;
        $modflavors[$TotalFlavors-1]->{Name} = $1;

Number of conditional arcs that need to be printed out in the sdf file being initialized $modflavors[$TotalFlavors-1]->{NumConds} = 0;

Initialize counter $CurrentCond = 0;
    }

#Conditional paths involved
Parse the munge file for pin information and values if(/COND\s+?\"(.*?)\"\s+?(.*?)\s+?(.*?)\s+?(.*?)/) {
            $modflavors[$TotalFlavors-1]->{Conditions}[$CurrentCond]{cond} = $1;
            $modflavors[$TotalFlavors-1]->{Conditions}[$CurrentCond]{inpin} = $2;
``` sdf_munge

```
            $modflavors($TotalFlavors-1)->{Conditions}[$CurrentCond]{outpin} = $3;
            $modflavors($TotalFlavors-1)->{Conditions}[$CurrentCond]{value1} = $4;
            $modflavors($TotalFlavors-1)->{Conditions}[$CurrentCond]{value2} = $5;
            $CurrentCond++;
            $modflavors($TotalFlavors-1)->{NumConds}++;
        }

}
Read in the sdf foreach $file ( @files.) { open(VFILE, "<$file") || die("Can't open SDF file: $file\n");
    if($stdout) {
        select(STDOUT);
    }
    else {
Create the new sdf file with conditional constructs in it $sfile = `basename $file .sdf`;
        $sfile = $sfile . ".newsdf";
        $sfile =~ s/\n//;
        open(SFILE, ">$sfile") || die ("Can't open output file: $sfile\n");
        select(SFILE);
    } while(<VFILE>)
    {
        if( /\(\s*?CELL\s*?\n/ ) {
            $CurrentCell = "";
            $ThisCellIsSpecial = 0;
            $IncludeHeader = 0;
        }
        elsif( /CELLTYPE\s+\"(.*)\"/ ) {
            $CurrentCell = $1;
            $ThisCellIsSpecial = 0;
            for($FlavorNum = 0;
                $FlavorNum < $TotalFlavors && !$ThisCellIsSpecial;
                $FlavorNum++) {
                $celltype = $modflavors($FlavorNum)->{Name};
                if( $CurrentCell =~ /$celltype/ ) {
                    $ThisCellIsSpecial = 1;
                    $flavor = $FlavorNum;
                    if ($PrintOnlyChanged) {
                        print "(CELL\n";
                    }
                }
            }
        }
        if ($ThisCellIsSpecial) {
###############################################################
# Munges the IOPATH section of the SDF file                   #
#                                                             #
###############################################################
            if ( /IOPATH\s+?(.*?)\s+?(.*?)\s+?(.*)/) {
                $input_pin = $1;
                $output_pin = $2;
                $matchstr = $3;
                $matchstr =~ s/\(//g;
                $matchstr =~ s/\s//g;
                @triplets = split ( /\)/ , $matchstr);
                # Check for condition
                $PathIsConditional = 0;
                $IOPathPrinted = 0;
                for($CondNum = 0;
                    $CondNum < $modflavors($FlavorNum-1)->{NumConds};
                    $CondNum++) {
                    if($input_pin eq $modflavors($FlavorNum-1)->{Conditions}[$CondNum]{inpin}
                       && $output_pin eq $modflavors($FlavorNum-1)->{Conditions}[$CondNum]{outpin})
``` sdf_munge

```
            $PathIsConditional = 1;
            $IOPathPrinted = 1;
        }
        if($PathIsConditional) {
            print "\t(COND (";
            print "$modflavors($FlavorNum-1)->{Conditions}[$CondNum]{cond})" ;
            print "\t(IOPATH $modflavors($FlavorNum-1)->{Conditions}[$CondNum]{inpin} $modflavors($FlavorNum-1)->{Conditions}[$CondNum]{outpin} ";

@time_rise = split (/:/,$triplets[0]);
            @time_fall = split (/:/,$triplets[1]);

if(($#time_rise > 0) || ($#time_fall > 0)) { if(($modflavors($FlavorNum-1)->{Conditions}[$CondNum]{value1} eq MIN)) {
                    $min = 1;
                    if($min)
                    {
                        if ($time_rise[0] <= $time_rise[1]) {
                            $time_value = $time_rise[0];
                        }
                        else {
                            $time_value = $time_rise[1];
                        }
                        if ($time_value >= $time_rise[2]) {
                            $time_value = $time_rise[2];
                        } print "($time_value:$time_value:$time_value) "
                    }

}
                elsif(($modflavors($FlavorNum-1)->{Conditions}[$CondNum]{value1} eq MAX)

$max = 1;
                    if($max)
                    {
                        if ($time_rise[0] >= $time_rise[1])
                        {
                            $time_value = $time_rise[0];
                        }
                        else
                        {
                            $time_value = $time_rise[1];
                        }
                        if ($time_value <= $time_rise[2])
                        {
                            $time_value = $time_rise[2];
                        }
                        print "($time_value:$time_value:$time_value) "
                    }

}
                elsif(($modflavors($FlavorNum-1)->{Conditions}[$CondNum]{value1} eq TYP)

$typ = 1;
                    if($typ)
                    {
                        if (($time_rise[0] <= $time_rise[1] && $time_rise[0] >= $time_rise[2]) || ($time_rise[0] <= $time_rise[2] && $time_rise[0] >= $time_rise[1]))
                        {
                            $time_value = $time_rise[0];
                        }
                        elsif(($time_rise[1] <= $time_rise[2] && $time_rise[1] >= $time_rise[0]) || ($time_rise[1] <= $time_rise[0] && $time_rise[1] >= $time_rise[2]))
                        {
                            $time_value = $time_rise[1];
                        }
                        else
                        {
                            $time_value = $time_rise[2];
                        }
``` sdf_munge

```
            print  "($time_value:$time_value:$time_value) "

}

}
    if(($modflavors($FlavorNum-1)->{Conditions}[$CondNum]{value2} eq MIN)) {
        $min = 1;
        if($min)
        {
            if ($time_fall[0] <= $time_fall[1]) {
                $time_value = $time_fall[0];
            }
            else {
                $time_value = $time_fall[1];
            }
            if ($time_value >= $time_fall[2]) {
                $time_value = $time_fall[2];
            } print  "($time_value:$time_value:$time_value) "

}

}
    elsif(($modflavors($FlavorNum-1)->{Conditions}[$CondNum]{value2} eq MAX)
        {
        $max = 1;
        if($max) {
            if ($time_fall[0] >= $time_fall[1])
            {
                $time_value = $time_fall[0];
            }
            else
            {
                $time_value = $time_fall[1];
            }
            if ($time_value <= $time_fall[2])
            {
                $time_value = $time_fall[2];
            }
            print  "($time_value:$time_value:$time_value) "
            }

}
        elsif(($modflavors($FlavorNum-1)->{Conditions}[$CondNum]{value2} eq TYP)
        {
            $typ = 1;
            if($typ)
            {
                if (($time_fall[0] <= $time_fall[1] && $time_fall[0] >= $time_fall[2]) || ($time_fall[0] <= $time_fall[2] && $time_fall[0] >= $time_fall[1]))
                {
                    $time_value = $time_fall[0];
                }
                elsif(($time_fall[1] <= $time_fall[2] && $time_fall[1] >= $time_fall[0]) || ($time_fall[1] <= $time_fall[0] && $time_fall[1] >= $time_fall[2]))
                {
                    $time_value = $time_fall[1];
                }
                else
                {
                    $time_value = $time_fall[2];
                }
                print  "($time_value:$time_value:$time_value) "

}

}

$PathIsConditional = 0;
``` sdf_munge

```
                )
                else {
                    print "() "
                }
                print ")\n";
            }
        }
        if(!$IOPathPrinted && !$PrintOnlyChanged) {
            print "$_";
        }
    }
    elsif (!$IncludeHeader) {
        print "$_";
    }
}
elsif (!$PrintOnlyChanged || $IncludeHeader) {
    print "$_";
}
    }

} sub usage {
    print "\nUsage: sdf_munge [options] <SDF file>\n\n";
    print "sdf_munge creates a SDF file with conditional delays, using either fast, typical\n";
    print "or slow values, based on the parameter specified in the munge.list file, for use\n";
    print "in back-annotation to models where conditional delays are used. The new SDF file\n";
    print "is named <cellname>.newsdf\n\n";
    print "Options:\n\n";
    print "-stdout   -\t\tPrint output to STDOUT instead of to a file.\n";
    print "-changes  -\t\tInclude only cells that changed in the output file\n";
    print "-complete -\t\tWhen printing only changed cells also include the\n";
    print " \t\t       SDF header so that the output file will be a 'complete'\n";
    print " \t\t       SDF file\n";
    exit 0;
}
```

```
                              munge.list

CELLTYPE SCSI4ULVDLS33
//LVD section
COND "LVD == 1'b1" I1 PADM MAX MAX
COND "LVD == 1'b1" WRB PADM MAX MAX MAX MAX MAX MAX
COND "LVD == 1'b1" PADM Z MAX MAX //SE section
COND "LVD == 1'b0 && ANE == 1'b1" WRB PADM MIN TYP MIN MIN TYP TYP
COND "LVD == 1'b0 && ANE == 1'b0" WRB PADM TYP TYP TYP TYP TYP TYP
COND "LVD == 1'b0 && ANE == 1'b1" I1 PADM MIN TYP
COND "LVD == 1'b0 && ANE == 1'b0" I1 PADM TYP TYP
COND "LVD == 1'b0" PADM Z MIN MIN
``` scsiulvdls33.sdf

```
(DELAYFILE
 (SDFVERSION "3.0")
 (DESIGN "scsiulvdls33_test")
 (DATE "05/01/2001 11:32:15")
 (VENDOR "LSI LOGIC")
 (PROGRAM "LSIDELAY")
 (VERSION "62")
 (DIVIDER /)
 (VOLTAGE 1.71::)
 (PROCESS "1.17::")
 (TEMPERATURE 115.00::)
 (TIMESCALE 1ns)
 (CELL
  (CELLTYPE "scsiulvdls33_test")
  (INSTANCE scsiulvdls33_test)
   (DELAY
    (ABSOLUTE
      (INTERCONNECT  X001/PO    L005/A  (0.000:0.000:0.000)  (0.005:0.006:0.007))
      (INTERCONNECT  X001/PADP  L001/A  (0.000:0.000:0.000)  (0.000:1.194:3.039))
      (INTERCONNECT  X001/Z     L004/A  (0.000:0.000:0.000)  (0.012:0.012:0.012))
      (INTERCONNECT  X001/PADM  L002/A  (0.000:0.000:0.000)  (0.000:0.488:0.741))
      (INTERCONNECT  X002/PO    L010/A  (0.000:0.000:0.000)  (0.033:0.033:0.033))
      (INTERCONNECT  X002/PADP  L006/A  (0.000:0.000:0.000)  (0.000:1.189:3.016))
      (INTERCONNECT  X002/Z     L009/A  (0.000:0.000:0.000)  (0.013:0.013:0.013))
      (INTERCONNECT  X002/PADM  L007/A  (0.000:0.000:0.000)  (0.000:0.496:0.753))
      (INTERCONNECT  X003/PO    L015/A  (0.000:0.000:0.000)  (0.060:0.060:0.061))
      (INTERCONNECT  X003/PADP  L011/A  (0.000:0.000:0.000)  (0.000:1.119:2.663))
      (INTERCONNECT  X003/Z     L014/A  (0.000:0.000:0.000)  (0.014:0.014:0.014))
      (INTERCONNECT  X003/PADM  L012/A  (0.000:0.000:0.000)  (0.000:0.622:0.931))
      (INTERCONNECT  X004/PO    L020/A  (0.000:0.000:0.000)  (0.115:0.115:0.116))
      (INTERCONNECT  X004/PADP  L016/A  (0.000:0.000:0.000)  (0.000:1.071:2.421))
      (INTERCONNECT  X004/Z     L019/A  (0.000:0.000:0.000)  (0.016:0.016:0.016))
      (INTERCONNECT  X004/PADM  L017/A  (0.000:0.000:0.000)  (0.000:0.708:1.054))
    )
   )
  )
 (CELL
  (CELLTYPE "SCSIULVDLS33")
  (INSTANCE X001)
   (DELAY
    (ABSOLUTE
     (IOPATH CLK PADP (9.253:9.253:9.253) (9.304:9.304:9.304) )
     (IOPATH CLK PADM (10.553:10.553:10.553) (10.887:10.887:10.887) )
     (IOPATH PI PO (0.074:0.074:0.074) (3.419:3.419:3.419) )
     (IOPATH PADP PO (4.075:4.075:4.075) (3.366:3.366:3.366) )
     (IOPATH PADM PO (4.075:4.075:4.075) (3.098:3.098:3.098) )
     (IOPATH ANE PADM (14.599:14.599:14.599) (4.508:4.508:4.508) )
     (IOPATH I PADP (6.912:6.912:6.912) (10.730:10.730:10.730) )
     (IOPATH PADP Z (3.290:3.290:3.290) (3.984:3.984:3.984) )
     (IOPATH WRB PADP () () (37.825:37.825:37.825) (30.818:30.818:30.818) (34.855:34.855:34.855) (20.
885:20.885:20.885) )
     (IOPATH WRB PADM () () (24.966:31.824:38.682) (6.451:10.682:14.913) (2.053:19.307:36.562) (4.090
:14.874:25.657) )
     (IOPATH PADM Z (1.007:2.015:3.023) (1.196:2.590:3.984) )
     (IOPATH I PADM (7.061:12.003:16.946) (4.562:7.719:10.876) )
    )
   )
   (TIMINGCHECK
    (WIDTH (posedge CLK) (0.078:0.078:0.078))
    (WIDTH (negedge CLK) (0.141:0.141:0.141))
    (SETUPHOLD (negedge I) (posedge CLK) (0.237:0.237:0.237) (0.134:0.134:0.134))
    (SETUPHOLD (posedge I) (posedge CLK) (0.230:0.230:0.230) (0.137:0.137:0.137))
   )
  )
 (CELL
  (CELLTYPE "SCSIULVDLS33")
  (INSTANCE X002)
   (DELAY
    (ABSOLUTE.
     (IOPATH CLK PADP (9.358:9.358:9.358) (9.393:9.393:9.393) )
     (IOPATH CLK PADM (10.679:10.679:10.679) (11.008:11.008:11.008) )
     (IOPATH PI PO (0.317:0.317:0.317) (3.676:3.676:3.676) )
     (IOPATH PADP PO (4.337:4.337:4.337) (3.641:3.641:3.641) )
     (IOPATH PADM PO (4.337:4.337:4.337) (3.365:3.365:3.365) )
``` scsiulvdls33.sdf

```
       (IOPATH ANE PADM (14.649:14.649:14.649) (4.580:4.580:4.580) )
       (IOPATH I PADP (6.977:6.977:6.977) (10.862:10.862:10.862) )
       (IOPATH PADP Z (3.308:3.308:3.308) (3.995:3.995:3.995) )
       (IOPATH WRB PADP () () (37.825:37.825:37.825) (30.871:30.871:30.871) (34.855:34.855:34.855) (20.
929:20.929:20.929) )
       (IOPATH WRB PADM () () (24.966:31.824:38.682) (6.501:10.732:14.964) (2.052:19.307:36.561) (4.164
:14.954:25.744) )
       (IOPATH PADM Z (1.017:2.024:3.032) (1.207:2.601:3.995) )
       (IOPATH I PADM (7.123:12.054:16.986) (4.634:7.825:11.015) )
      )
     )
     (TIMINGCHECK
       (WIDTH (posedge CLK) (0.078:0.078:0.078))
       (WIDTH (negedge CLK) (0.141:0.141:0.141))
       (SETUPHOLD (negedge I) (posedge CLK) (0.237:0.237:0.237) (0.134:0.134:0.134))
       (SETUPHOLD (posedge I) (posedge CLK) (0.230:0.230:0.230) (0.137:0.137:0.137))
     )
   )
   (CELL
    (CELLTYPE "SCSIULVDLS33")
    (INSTANCE X003)
     (DELAY
      (ABSOLUTE
       (IOPATH CLK PADP (10.941:10.941:10.941) (10.728:10.728:10.728) )
       (IOPATH CLK PADM (12.570:12.570:12.570) (12.840:12.840:12.840) )
       (IOPATH PI PO (0.558:0.558:0.558) (3.926:3.926:3.926) )
       (IOPATH PADP PO (4.592:4.592:4.592) (3.930:3.930:3.930) )
       (IOPATH PADM PO (4.592:4.592:4.592) (3.531:3.531:3.531) )
       (IOPATH ANE PADM (15.414:15.414:15.414) (5.676:5.676:5.676) )
       (IOPATH I PADP (7.952:7.952:7.952) (12.866:12.866:12.866) )
       (IOPATH PADP Z (3.345:3.345:3.345) (4.006:4.006:4.006) )
       (IOPATH WRB PADP () () (37.825:37.825:37.825) (31.670:31.670:31.670) (34.854:34.854:34.854) (21.
597:21.597:21.597) )
       (IOPATH WRB PADM () () (24.966:31.824:38.682) (7.247:11.486:15.725) (2.046:19.302:36.559) (5.283
:16.174:27.066) )
       (IOPATH PADM Z (0.931:1.938:2.946) (1.218:2.612:4.006) )
       (IOPATH I PADM (8.065:12.832:17.598) (5.727:9.417:13.107) )
      )
     )
     (TIMINGCHECK
       (WIDTH (posedge CLK) (0.078:0.078:0.078))
       (WIDTH (negedge CLK) (0.141:0.141:0.141))
       (SETUPHOLD (negedge I) (posedge CLK) (0.237:0.237:0.237) (0.134:0.134:0.134))
       (SETUPHOLD (posedge I) (posedge CLK) (0.230:0.230:0.230) (0.137:0.137:0.137))
     )
   )
   (CELL
    (CELLTYPE "SCSIULVDLS33")
    (INSTANCE X004)
     (DELAY
      (ABSOLUTE
       (IOPATH CLK PADP (12.030:12.030:12.030) (11.647:11.647:11.647) )
       (IOPATH CLK PADM (13.872:13.872:13.872) (14.100:14.100:14.100) )
       (IOPATH PI PO (1.040:1.040:1.040) (4.425:4.425:4.425) )
       (IOPATH PADP PO (5.104:5.104:5.104) (4.481:4.481:4.481) )
       (IOPATH PADM PO (5.104:5.104:5.104) (3.997:3.997:3.997) )
       (IOPATH ANE PADM (15.940:15.940:15.940) (6.430:6.430:6.430) )
       (IOPATH I PADP (8.623:8.623:8.623) (14.245:14.245:14.245) )
       (IOPATH PADP Z (3.392:3.392:3.392) (4.027:4.027:4.027) )
       (IOPATH WRB PADP () () (37.825:37.825:37.825) (32.220:32.220:32.220) (34.853:34.853:34.853) (22.
056:22.056:22.056) )
       (IOPATH WRB PADM () () (24.966:31.824:38.682) (7.761:12.005:16.248) (2.042:19.299:36.557) (6.053
:17.014:27.975) )
       (IOPATH PADM Z (0.892:1.900:2.908) (1.240:2.633:4.027) )
       (IOPATH I PADM (8.714:13.366:18.019) (6.479:10.512:14.546) )
      )
     )
     (TIMINGCHECK
       (WIDTH (posedge CLK) (0.078:0.078:0.078))
       (WIDTH (negedge CLK) (0.141:0.141:0.141))
       (SETUPHOLD (negedge I) (posedge CLK) (0.237:0.237:0.237) (0.134:0.134:0.134))
       (SETUPHOLD (posedge I) (posedge CLK) (0.230:0.230:0.230) (0.137:0.137:0.137))
     )
   )
``` scsiulvdls33.sdf

```
(CELL
 (CELLTYPE "LOAD00")
 (INSTANCE L001)
 (DELAY
  (ABSOLUTE
   (IOPATH A Z (0.189:0.189:0.189) (0.217:0.217:0.217) )
  )
 )
)
(CELL
 (CELLTYPE "LOAD00")
 (INSTANCE L002)
 (DELAY
  (ABSOLUTE
   (IOPATH A Z (0.189:0.189:0.189) (0.217:0.217:0.217) )
  )
 )
)
(CELL
 (CELLTYPE "LOAD00")
 (INSTANCE L003)
 (DELAY
  (ABSOLUTE
   (IOPATH A Z (0.189:0.189:0.189) (0.217:0.217:0.217) )
  )
 )
)
(CELL
 (CELLTYPE "LOAD00")
 (INSTANCE L004)
 (DELAY
  (ABSOLUTE
   (IOPATH A Z (0.207:0.207:0.207) (0.240:0.240:0.240) )
  )
 )
)
(CELL
 (CELLTYPE "LOAD00")
 (INSTANCE L005)
 (DELAY
  (ABSOLUTE
   (IOPATH A Z (0.205:0.205:0.205) (0.228:0.228:0.228) )
  )
 )
)
(CELL
 (CELLTYPE "LOAD10")
 (INSTANCE L006)
 (DELAY
  (ABSOLUTE
   (IOPATH A Z (0.189:0.189:0.189) (0.217:0.217:0.217) )
  )
 )
)
(CELL
 (CELLTYPE "LOAD10")
 (INSTANCE L007)
 (DELAY
  (ABSOLUTE
   (IOPATH A Z (0.189:0.189:0.189) (0.217:0.217:0.217) )
  )
 )
)
(CELL
 (CELLTYPE "LOAD01")
 (INSTANCE L008)
 (DELAY
  (ABSOLUTE
   (IOPATH A Z (0.189:0.189:0.189) (0.217:0.217:0.217) )
  )
 )
)
(CELL
 (CELLTYPE "LOAD01")
``` scsiulvdls33.sdf

```
(INSTANCE L009)
 (DELAY
  (ABSOLUTE
   (IOPATH A Z (0.211:0.211:0.211) (0.243:0.243:0.243) )
  )
 )
)
(CELL
 (CELLTYPE "LOAD01")
 (INSTANCE L010)
  (DELAY
   (ABSOLUTE
    (IOPATH A Z (0.282:0.282:0.282) (0.301:0.301:0.301) )
   )
  )
)
(CELL
 (CELLTYPE "LOAD300")
 (INSTANCE L011)
  (DELAY
   (ABSOLUTE
    (IOPATH A Z (0.189:0.189:0.189) (0.217:0.217:0.217) )
   )
  )
)
(CELL
 (CELLTYPE "LOAD300")
 (INSTANCE L012)
  (DELAY
   (ABSOLUTE
    (IOPATH A Z (0.189:0.189:0.189) (0.217:0.217:0.217) )
   )
  )
)
(CELL
 (CELLTYPE "LOAD02")
 (INSTANCE L013)
  (DELAY
   (ABSOLUTE
    (IOPATH A Z (0.189:0.189:0.189) (0.217:0.217:0.217) )
   )
  )
)
(CELL
 (CELLTYPE "LOAD02")
 (INSTANCE L014)
  (DELAY
   (ABSOLUTE
    (IOPATH A Z (0.216:0.216:0.216) (0.246:0.246:0.246) )
   )
  )
)
(CELL
 (CELLTYPE "LOAD02")
 (INSTANCE L015)
  (DELAY
   (ABSOLUTE
    (IOPATH A Z (0.333:0.333:0.333) (0.367:0.367:0.367) )
   )
  )
)
(CELL
 (CELLTYPE "LOAD500")
 (INSTANCE L016)
  (DELAY
   (ABSOLUTE
    (IOPATH A Z (0.189:0.189:0.189) (0.217:0.217:0.217) )
   )
  )
)
(CELL
 (CELLTYPE "LOAD500")
 (INSTANCE L017)
  (DELAY
``` scsiulvdls33.sdf

```
      (ABSOLUTE
        (IOPATH A Z (0.189:0.189:0.189) (0.217:0.217:0.217) )
      )
    )
  )
  (CELL
   (CELLTYPE "LOAD04")
   (INSTANCE L018)
    (DELAY
      (ABSOLUTE
        (IOPATH A Z (0.189:0.189:0.189) (0.217:0.217:0.217) )
      )
    )
  )
  (CELL
   (CELLTYPE "LOAD04")
   (INSTANCE L019)
    (DELAY
      (ABSOLUTE
        (IOPATH A Z (0.226:0.226:0.226) (0.252:0.252:0.252) )
      )
    )
  )
  (CELL
   (CELLTYPE "LOAD04")
   (INSTANCE L020)
    (DELAY
      (ABSOLUTE
        (IOPATH A Z (0.385:0.385:0.385) (0.459:0.459:0.459) )
      )
    )
  )
  (CELL
   (CELLTYPE "DLY0")
   (INSTANCE D001)
    (DELAY
      (ABSOLUTE
        (IOPATH A Z (0.189:0.189:0.189) (0.217:0.217:0.217) )
      )
    )
  )
  (CELL
   (CELLTYPE "DLY0")
   (INSTANCE D002)
    (DELAY
      (ABSOLUTE
        (IOPATH A Z (0.189:0.189:0.189) (0.217:0.217:0.217) )
      )
    )
  )
  (CELL
   (CELLTYPE "DLY0")
   (INSTANCE D003)
    (DELAY
      (ABSOLUTE
        (IOPATH A Z (0.189:0.189:0.189) (0.217:0.217:0.217) )
      )
    )
  )
  (CELL
   (CELLTYPE "DLY0")
   (INSTANCE D004)
    (DELAY
      (ABSOLUTE
        (IOPATH A Z (0.189:0.189:0.189) (0.217:0.217:0.217) )
      )
    )
  )
  (CELL
   (CELLTYPE "DLY0")
   (INSTANCE D005)
    (DELAY
      (ABSOLUTE
        (IOPATH A Z (0.189:0.189:0.189) (0.217:0.217:0.217) )
``` scsiulvdls33.sdf

```
      )
     )
    )
   (CELL
    (CELLTYPE "DLY0")
    (INSTANCE D006)
     (DELAY
      (ABSOLUTE
       (IOPATH A Z (0.189:0.189:0.189) (0.217:0.217:0.217) )
      )
     )
   )
   (CELL
    (CELLTYPE "DLY0")
    (INSTANCE D007)
     (DELAY
      (ABSOLUTE
       (IOPATH A Z (0.189:0.189:0.189) (0.217:0.217:0.217) )
      )
     )
   )
   (CELL
    (CELLTYPE "DLY0")
    (INSTANCE D008)
     (DELAY
      (ABSOLUTE
       (IOPATH A Z (0.189:0.189:0.189) (0.217:0.217:0.217) )
      )
     )
   )
   (CELL
    (CELLTYPE "DLY0")
    (INSTANCE D009)
     (DELAY
      (ABSOLUTE
       (IOPATH A Z (0.189:0.189:0.189) (0.217:0.217:0.217) )
      )
     )
   )
   (CELL
    (CELLTYPE "DLY0")
    (INSTANCE D010)
     (DELAY
      (ABSOLUTE
       (IOPATH A Z (0.189:0.189:0.189) (0.217:0.217:0.217) )
      )
     )
   )
   (CELL
    (CELLTYPE "DLY0")
    (INSTANCE D011)
     (DELAY
      (ABSOLUTE
       (IOPATH A Z (0.189:0.189:0.189) (0.217:0.217:0.217) )
      )
     )
   )
   (CELL
    (CELLTYPE "DLY0")
    (INSTANCE D012)
     (DELAY
      (ABSOLUTE
       (IOPATH A Z (0.189:0.189:0.189) (0.217:0.217:0.217) )
      )
     )
   )
   (CELL
    (CELLTYPE "DLY0")
    (INSTANCE D013)
     (DELAY
      (ABSOLUTE
       (IOPATH A Z (0.189:0.189:0.189) (0.217:0.217:0.217) )
      )
     )
``` scsiulvdls33.sdf

```
 )
 (CELL
  (CELLTYPE "DLY0")
  (INSTANCE D014)
   (DELAY
    (ABSOLUTE
    (IOPATH A Z (0.189:0.189:0.189) (0.217:0.217:0.217) )
   )
  )
 )
 (CELL
  (CELLTYPE "DLY0")
  (INSTANCE D015)
   (DELAY
    (ABSOLUTE
    (IOPATH A Z (0.189:0.189:0.189) (0.217:0.217:0.217) )
   )
  )
 )
 (CELL
  (CELLTYPE "DLY0")
  (INSTANCE D016)
   (DELAY
    (ABSOLUTE
    (IOPATH A Z (0.189:0.189:0.189) (0.217:0.217:0.217) )
   )
  )
 )
 (CELL
  (CELLTYPE "DLY0")
  (INSTANCE D017)
   (DELAY
    (ABSOLUTE
    (IOPATH A Z (0.189:0.189:0.189) (0.217:0.217:0.217) )
   )
  )
 )
 (CELL
  (CELLTYPE "DLY0")
  (INSTANCE D018)
   (DELAY
    (ABSOLUTE
    (IOPATH A Z (0.189:0.189:0.189) (0.217:0.217:0.217) )
   )
  )
 )
 (CELL
  (CELLTYPE "DLY0")
  (INSTANCE D019)
   (DELAY
    (ABSOLUTE
    (IOPATH A Z (0.189:0.189:0.189) (0.217:0.217:0.217) )
   )
  )
 )
 (CELL
  (CELLTYPE "DLY0")
  (INSTANCE D020)
   (DELAY
    (ABSOLUTE
    (IOPATH A Z (0.189:0.189:0.189) (0.217:0.217:0.217) )
   )
  )
 )
)
``` scsiulvdls33.newsdf

```
/* Updated by lsicondsdfgen */
(CELL
   (CELLTYPE "SCSIULVDLS33")
   (INSTANCE X001)
   (DELAY
    (ABSOLUTE
     (COND (LVD == 1'b1)
       (IOPATH WRB PADM () () (38.682:38.682:38.682) (14.913:14.913:14.913) (36.562:36.562:36.562) (25.657:25.657:25.657) ))
     (COND (LVD == 1'b0 && ANE == 1'b1)
       (IOPATH WRB PADM () () (24.966:24.966:24.966) (6.451:6.451:6.451) (19.307:19.307:19.307) (14.874:14.874:14.874) ))
     (COND (LVD == 1'b0 && ANE == 1'b0)
       (IOPATH WRB PADM () () (31.824:31.824:31.824) (10.682:10.682:10.682) (19.307:19.307:19.307) (14.874:14.874:14.874) ))
     (COND (LVD == 1'b1)
       (IOPATH PADM Z (3.023:3.023:3.023) (3.984:3.984:3.984) ))
     (COND (LVD == 1'b0)
       (IOPATH PADM Z (1.007:1.007:1.007) (1.196:1.196:1.196) ))
     (COND (LVD == 1'b1)
       (IOPATH I PADM (16.946:16.946:16.946) (10.876:10.876:10.876) ))
     (COND (LVD == 1'b0 && ANE == 1'b1)
       (IOPATH I PADM (7.061:7.061:7.061) (7.719:7.719:7.719) ))
     (COND (LVD == 1'b0 && ANE == 1'b0)
       (IOPATH I PADM (12.003:12.003:12.003) (7.719:7.719:7.719) ))
    )
   )
)
(CELL
   (CELLTYPE "SCSIULVDLS33")
   (INSTANCE X002)
   (DELAY
    (ABSOLUTE
     (COND (LVD == 1'b1)
       (IOPATH WRB PADM () () (38.682:38.682:38.682) (14.964:14.964:14.964) (36.561:36.561:36.561) (25.744:25.744:25.744) ))
     (COND (LVD == 1'b0 && ANE == 1'b1)
       (IOPATH WRB PADM () () (24.966:24.966:24.966) (6.501:6.501:6.501) (19.307:19.307:19.307) (14.954:14.954:14.954) ))
     (COND (LVD == 1'b0 && ANE == 1'b0)
       (IOPATH WRB PADM () () (31.824:31.824:31.824) (10.732:10.732:10.732) (19.307:19.307:19.307) (14.954:14.954:14.954) ))
     (COND (LVD == 1'b1)
       (IOPATH PADM Z (3.032:3.032:3.032) (3.995:3.995:3.995) ))
     (COND (LVD == 1'b0)
       (IOPATH PADM Z (1.017:1.017:1.017) (1.207:1.207:1.207) ))
     (COND (LVD == 1'b1)
       (IOPATH I PADM (16.986:16.986:16.986) (11.015:11.015:11.015) ))
     (COND (LVD == 1'b0 && ANE == 1'b1)
       (IOPATH I PADM (7.123:7.123:7.123) (7.825:7.825:7.825) ))
     (COND (LVD == 1'b0 && ANE == 1'b0)
       (IOPATH I PADM (12.054:12.054:12.054) (7.825:7.825:7.825) ))
    )
   )
)
(CELL
   (CELLTYPE "SCSIULVDLS33")
   (INSTANCE X003)
   (DELAY
    (ABSOLUTE
     (COND (LVD == 1'b1)
       (IOPATH WRB PADM () () (38.682:38.682:38.682) (15.725:15.725:15.725) (36.559:36.559:36.559) (27.066:27.066:27.066) ))
     (COND (LVD == 1'b0 && ANE == 1'b1)
       (IOPATH WRB PADM () () (24.966:24.966:24.966) (7.247:7.247:7.247) (19.302:19.302:19.302) (16.174:16.174:16.174) ))
     (COND (LVD == 1'b0 && ANE == 1'b0)
       (IOPATH WRB PADM () () (31.824:31.824:31.824) (11.486:11.486:11.486) (19.302:19.302:19.302) (16.174:16.174:16.174) ))
     (COND (LVD == 1'b1)
       (IOPATH PADM Z (2.946:2.946:2.946) (4.006:4.006:4.006) ))
     (COND (LVD == 1'b0)
       (IOPATH PADM Z (0.931:0.931:0.931) (1.218:1.218:1.218) ))
     (COND (LVD == 1'b1)
``` scsiulvdls33.newsdf

```
        (IOPATH I PADM (17.598:17.598:17.598) (13.107:13.107:13.107) ))
      (COND (LVD == 1'b0 && ANE == 1'b1)
        (IOPATH I PADM (8.065:8.065:8.065) (9.417:9.417:9.417) ))
      (COND (LVD == 1'b0 && ANE == 1'b0)
        (IOPATH I PADM (12.832:12.832:12.832) (9.417:9.417:9.417) ))
      )
    )
  )
(CELL
  (CELLTYPE "SCSIULVDLS33")
  (INSTANCE X004)
    (DELAY
      (ABSOLUTE
      (COND (LVD == 1'b1)
        (IOPATH WRB PADM () () (38.682:38.682:38.682) (16.248:16.248:16.248) (36.557:36.557:36.557) (27.975:27.975:27.975) ))
      (COND (LVD == 1'b0 && ANE == 1'b1)
        (IOPATH WRB PADM () () (24.966:24.966:24.966) (7.761:7.761:7.761) (19.299:19.299:19.299) (17.014:17.014:17.014) ))
      (COND (LVD == 1'b0 && ANE == 1'b0)
        (IOPATH WRB PADM () () (31.824:31.824:31.824) (12.005:12.005:12.005) (19.299:19.299:19.299) (17.014:17.014:17.014) ))
      (COND (LVD == 1'b1)
        (IOPATH PADM Z (2.908:2.908:2.908) (4.027:4.027:4.027) ))
      (COND (LVD == 1'b0)
        (IOPATH PADM Z (0.892:0.892:0.892) (1.240:1.240:1.240) ))
      (COND (LVD == 1'b1)
        (IOPATH I PADM (18.019:18.019:18.019) (14.546:14.546:14.546) ))
      (COND (LVD == 1'b0 && ANE == 1'b1)
        (IOPATH I PADM (8.714:8.714:8.714) (10.512:10.512:10.512) ))
      (COND (LVD == 1'b0 && ANE == 1'b0)
        (IOPATH I PADM (13.366:13.366:13.366) (10.512:10.512:10.512) ))
      )
    )
  )
``` scsiulvdls33.newsdf

```
/* Updated by lsicondsdfgen */
(DELAYFILE
 (SDFVERSION "3.0")
 (DESIGN "scsiulvdls33_test")
 (DATE "05/01/2001 11:32:15")
 (VENDOR "LSI LOGIC")
 (PROGRAM "LSIDELAY")
 (VERSION "62")
 (DIVIDER /)
 (VOLTAGE 1.71::)
 (PROCESS "1.17::")
 (TEMPERATURE 115.00::)
 (TIMESCALE 1ns)
 (CELL
  (CELLTYPE "SCSIULVDLS33")
  (INSTANCE X001)
   (DELAY
    (ABSOLUTE
     (COND (LVD == 1'b1)
      (IOPATH WRB PADM () () (38.682:38.682:38.682) (14.913:14.913:14.913) (36.562:36.562:36.562) (25.657:25.657:25.657) ))
     (COND (LVD == 1'b0 && ANE == 1'b1)
      (IOPATH WRB PADM () () (24.966:24.966:24.966) (6.451:6.451:6.451) (19.307:19.307:19.307) (14.874:14.874:14.874) ))
     (COND (LVD == 1'b0 && ANE == 1'b0)
      (IOPATH WRB PADM () () (31.824:31.824:31.824) (10.682:10.682:10.682) (19.307:19.307:19.307) (14.874:14.874:14.874) ))
     (COND (LVD == 1'b1)
      (IOPATH PADM Z (3.023:3.023:3.023) (3.984:3.984:3.984) ))
     (COND (LVD == 1'b0)
      (IOPATH PADM Z (1.007:1.007:1.007) (1.196:1.196:1.196) ))
     (COND (LVD == 1'b1)
      (IOPATH I PADM (16.946:16.946:16.946) (10.876:10.876:10.876) ))
     (COND (LVD == 1'b0 && ANE == 1'b1)
      (IOPATH I PADM (7.061:7.061:7.061) (7.719:7.719:7.719) ))
     (COND (LVD == 1'b0 && ANE == 1'b0)
      (IOPATH I PADM (12.003:12.003:12.003) (7.719:7.719:7.719) ))
    )
   )
 )
 (CELL
  (CELLTYPE "SCSIULVDLS33")
  (INSTANCE X002)
   (DELAY
    (ABSOLUTE
     (COND (LVD == 1'b1)
      (IOPATH WRB PADM () () (38.682:38.682:38.682) (14.964:14.964:14.964) (36.561:36.561:36.561) (25.744:25.744:25.744) ))
     (COND (LVD == 1'b0 && ANE == 1'b1)
      (IOPATH WRB PADM () () (24.966:24.966:24.966) (6.501:6.501:6.501) (19.307:19.307:19.307) (14.954:14.954:14.954) ))
     (COND (LVD == 1'b0 && ANE == 1'b0)
      (IOPATH WRB PADM () () (31.824:31.824:31.824) (10.732:10.732:10.732) (19.307:19.307:19.307) (14.954:14.954:14.954) ))
     (COND (LVD == 1'b1)
      (IOPATH PADM Z (3.032:3.032:3.032) (3.995:3.995:3.995) ))
     (COND (LVD == 1'b0)
      (IOPATH PADM Z (1.017:1.017:1.017) (1.207:1.207:1.207) ))
     (COND (LVD == 1'b1)
      (IOPATH I PADM (16.986:16.986:16.986) (11.015:11.015:11.015) ))
     (COND (LVD == 1'b0 && ANE == 1'b1)
      (IOPATH I PADM (7.123:7.123:7.123) (7.825:7.825:7.825) ))
     (COND (LVD == 1'b0 && ANE == 1'b0)
      (IOPATH I PADM (12.054:12.054:12.054) (7.825:7.825:7.825) ))
    )
   )
 )
 (CELL
  (CELLTYPE "SCSIULVDLS33")
  (INSTANCE X003)
   (DELAY
    (ABSOLUTE
     (COND (LVD == 1'b1)
      (IOPATH WRB PADM () () (38.682:38.682:38.682) (15.725:15.725:15.725) (36.559:36.559:36.559) (2
``` scsiulvdls33.newsdf

```
7.066:27.066:27.066) ))
      (COND (LVD == 1'b0 && ANE == 1'b1)
        (IOPATH WRB PADM () () (24.966:24.966:24.966) (7.247:7.247:7.247) (19.302:19.302:19.302) (16.1
74:16.174:16.174) ))
      (COND (LVD == 1'b0 && ANE == 1'b0)
        (IOPATH WRB PADM () () (31.824:31.824:31.824) (11.486:11.486:11.486) (19.302:19.302:19.302) (1
6.174:16.174:16.174) ))
      (COND (LVD == 1'b1)
        (IOPATH PADM Z (2.946:2.946:2.946) (4.006:4.006:4.006) ))
      (COND (LVD == 1'b0)
        (IOPATH PADM Z (0.931:0.931:0.931) (1.218:1.218:1.218) ))
      (COND (LVD == 1'b1)
        (IOPATH I PADM (17.598:17.598:17.598) (13.107:13.107:13.107) ))
      (COND (LVD == 1'b0 && ANE == 1'b1)
        (IOPATH I PADM (8.065:8.065:8.065) (9.417:9.417:9.417) ))
      (COND (LVD == 1'b0 && ANE == 1'b0)
        (IOPATH I PADM (12.832:12.832:12.832) (9.417:9.417:9.417) ))
    )
   )
 )
 (CELL
   (CELLTYPE "SCSIULVDLS33")
   (INSTANCE X004)
   (DELAY
    (ABSOLUTE
      (COND (LVD == 1'b1)
        (IOPATH WRB PADM () () (38.682:38.682:38.682) (16.248:16.248:16.248) (36.557:36.557:36.557) (2
7.975:27.975:27.975) ))
      (COND (LVD == 1'b0 && ANE == 1'b1)
        (IOPATH WRB PADM () () (24.966:24.966:24.966) (7.761:7.761:7.761) (19.299:19.299:19.299) (17.0
14:17.014:17.014) ))
      (COND (LVD == 1'b0 && ANE == 1'b0)
        (IOPATH WRB PADM () () (31.824:31.824:31.824) (12.005:12.005:12.005) (19.299:19.299:19.299) (1
7.014:17.014:17.014) ))
      (COND (LVD == 1'b1)
        (IOPATH PADM Z (2.908:2.908:2.908) (4.027:4.027:4.027) ))
      (COND (LVD == 1'b0)
        (IOPATH PADM Z (0.892:0.892:0.892) (1.240:1.240:1.240) ))
      (COND (LVD == 1'b1)
        (IOPATH I PADM (18.019:18.019:18.019) (14.546:14.546:14.546) ))
      (COND (LVD == 1'b0 && ANE == 1'b1)
        (IOPATH I PADM (8.714:8.714:8.714) (10.512:10.512:10.512) ))
      (COND (LVD == 1'b0 && ANE == 1'b0)
        (IOPATH I PADM (13.366:13.366:13.366) (10.512:10.512:10.512) ))
    )
   )
 )
)
```

Other modifications, variations, and arrangements of the present invention may be made in accordance with the above teachings other than as specifically described to practice the invention within the spirit and scope defined by the following claims.

What is claimed is:

1. A method of generating a back-annotated standard delay format file for designing integrated circuits comprising the steps of:
   (a) receiving as inputs a main input file, a conditional delay specifications file, and a selected option switch;
   (b) inserting delay information from the conditional delay specifications file for a cell entry in the main input file into an output data structure according to the selected option switch; and
   (c) generating the back-annotated standard delay format file from the output data structure.

2. The method of claim 1 wherein the selected option switch is a "slow" switch, a "fast" switch, a "changes" switch, or a "complete" switch.

3. The method of claim 2 wherein step (b) comprises the steps of:
   (b1) receiving as input a cell entry for the integrated circuit design from the main input file;
   (b2) if the cell entry is an end-of-file, then continuing from step (c), otherwise continuing from step (b3);
   (b3) if the cell entry introduces a new cell, then continuing from step (b6), otherwise continuing from step (b4)
   (b4) if the selected option switch is the "changes" switch, then continuing from step (b1), otherwise continuing from step (b5);
   (b5) inserting the cell entry into the output data structure and continuing from step (b1);
   (b6) if the cell entry represents a Small Computer Standard Interface cell, a Universal Serial Bus cell, or a Peripheral Component Interconnect cell, then continuing from step (b7), otherwise continuing from step (b4);
   (b7) receiving as input a line from the cell entry;
   (b8) if the line from the cell entry is a last line of the cell entry, then continuing from step (b5), otherwise continuing from step (b9);
   (b9) if the line from the cell entry contains timing information, then continuing from step (b11), otherwise continuing from step (b10);
   (b10) inserting the cell entry into the output data structure and continuing from step (b7);
   (b11) parsing the timing information for the cell entry from the main input file;
   (b12) if the selected option switch is the "fast" switch, then continuing from step (b13), otherwise continuing from step (b14);
   (b13) selecting the delays having the smallest magnitude for the cell entry from the conditional delay specifications file and continuing from step (b15);
   (b14) selecting the delays having the largest magnitude for the cell entry from the conditional delay specifications file; and
   (b15) inserting the selected delays into the output data structure and continuing from step (b7).

4. The method of claim 2 wherein step (b) comprises the following steps:
   (b1) parsing the conditional delay specifications file to generate a conditional delay data structure for each cell in the conditional delay specifications file;
   (b2) receiving as input a cell entry for the integrated circuit design from the main input file;
   (b3) if the cell entry is an end-of-file, then continuing from step (c), otherwise continuing from step (b4)
   (b4) if the cell entry introduces a new cell, then continuing from step (b7), otherwise continuing from step (b5);
   (b5) if the selected option switch is the "changes" switch, then continuing from step (b2), otherwise continuing from step (b6);
   (b6) inserting the cell entry into the output data structure and continuing from step (b2);
   (b7) if the cell entry has a name identical to that of a cell in the conditional delay specifications file, then continuing from step (b8), otherwise continuing from step (b5); and
   (b8) inserting the cell entry and corresponding selected rise/fall data from the conditional delay data structure into the output data structure and continuing from step (b5).

5. The method of claim 4 wherein step (b1) comprises the following steps:
   (b1-1) receiving as input a conditional delay string or an end-of-file from the conditional delay specifications file;
   (b1-2) if an end-of-file is received, then continuing from step (b2), otherwise continuing from step (b1-3);
   (b1-3) if the conditional delay string begins a new cell, then continuing at step (b1-4), otherwise continuing from step (b1-5);
   (b1-4) initializing a new conditional delay data structure with the name of the new cell and continue processing from step (b1-1);
   (b1-5) searching the conditional delay string for an input condition symbol and inserting the input condition symbol in the new conditional delay data structure;
   (b1-6) parsing a subsequent two substrings in the conditional delay string respectively as an input pin name and an output pin name for a conditional input/output path;
   (b1-7) storing the input pin name and the output pin name in the new conditional delay data structure;
   (b1-8) parsing a subsequent two substrings in the conditional delay string respectively as a rise time and a fall time; and
   (b1-9) storing the rise time and the fall time in the new conditional delay data structure and continuing processing from step (b1-1).

6. The method of claim 5 wherein step (b8) comprises the following steps:
   (b8-1) receiving as input a line from the cell entry;
   (b8-2) if the line from the cell entry contains timing information, then continuing from step (b8-5), otherwise continuing from step (b8-3);
   (b8-3) if the line from the cell entry is a last line of the cell entry, then continuing from step (b6), otherwise continuing from step (b8-4);
   (b8-4) inserting the cell entry into the output data structure and continuing from step (b8-1);
   (b8-5) if a pin pair from the line from the cell entry is identical to a pin pair in the conditional delay data structure, then continuing from step (b8-6), otherwise continuing from step (b8-3);
   (b8-6) inserting an output condition from the conditional delay data structure and the pin pair from the line from the cell entry into the output data structure;

(b8-7) parsing timing data for minimum, maximum, and typical delay values from the main input file for the cell entry;

(b8-8) if a rise time is specified in the conditional delay specifications file for the cell entry as a minimum delay, then continuing from step (b8-12), otherwise continuing from step (b8-9);

(b8-9) if the rise time is specified in the conditional delay specifications file for the cell entry as a maximum delay, then continuing from step (b8-10), otherwise continuing from step (b8-11);

(b8-10) selecting a largest delay time for the cell entry from the main input file and continuing from step (b8-13);

(b8-11) selecting an average delay time for the cell entry from the main input file and continuing from step (b8-13);

(b8-12) selecting a smallest delay time for the cell entry from the main input file;

(b8-13) if the fall time for the cell entry is specified in the conditional delay specifications file as a minimum delay, then continuing from step (b8-17), otherwise continuing from step (b8-14);

(b8-14) if the fall time for the cell entry is specified in the conditional delay specifications file as a maximum delay, then continuing from step (b8-15), otherwise continuing from step (b8-16);

(b8-15) selecting a largest delay time for the cell entry from the main input file and continuing from step (b8-18);

(b8-16) selecting an average delay time for the cell entry from the main input file and continuing from step (b8-18);

(b8-17) selecting a smallest delay time for the cell entry from the main input file; and (b8-18) inserting the selected delay time for the cell entry from the main input file into the output data structure and continuing from step (b8-1).

7. A computer program product comprising:
a medium for embodying a computer program for input to a computer; and
a computer program embodied in the medium for causing the computer to perform at least one of the following functions:
(a) receiving as inputs a main input file, a conditional delay specifications file, and a selected option switch;
(b) inserting delay information from the conditional delay specifications file for each cell entry in the main input file according to the selected option switch into an output data structure; and
(c) generating the back-annotated standard delay format file from the output data structure.

8. The computer program product of claim 7 wherein the selected option switch is a "slow" switch, a "fast" switch, a "changes" switch, or a "complete" switch.

9. The computer program product of claim 8 wherein step (b) comprises the steps of:
(b1) receiving as input a cell entry for the integrated circuit design from the main input file;
(b2) if the cell entry is an end-of-file, then continuing from step (c), otherwise continuing from step (b3);
(b3) if the cell entry introduces a new cell, then continuing from step (b6), otherwise continuing from step (b4);
(b4) if the selected option switch is the "changes" switch, then continuing from step (b1), otherwise continuing from step (b5);

(b5) inserting the cell entry into the output data structure and continuing from step (b1);
(b6) if the cell entry represents a Small Computer Standard Interface cell, a Universal Serial Bus cell, or a Peripheral Component Interconnect cell, then continuing from step (b7), otherwise continuing from step (b4);
(b7) receiving as input a line from the cell entry;
(b8) if the line from the cell entry is a last line of the cell entry, then continuing from step (b5), otherwise continuing from step ((b9));
((b9)) if the line from the cell entry contains timing information, then continuing from step (b11), otherwise continuing from step (b10);
(b10) inserting the cell entry into the output data structure and continuing from step (b7);
(b11) parsing the timing information for the cell entry from the main input file;
(b12) if the selected option switch is the "fast" switch, then continuing from step (b13), otherwise continuing from step (b14);
(b13) selecting the delays having the smallest magnitude for the cell entry from the conditional delay specifications file and continuing from step (b15);
(b14) selecting the delays having the largest magnitude for the cell entry from the conditional delay specifications file; and
(b15) inserting the selected delays into the output data structure and continuing from step (b7).

10. The computer program product of claim 9 herein step (b) comprises the following steps:
(b1) parsing the conditional delay specifications file to generate a conditional delay data structure;
(b2) receiving as input a cell entry for the integrated circuit design from the main input file;
(b3) if the cell entry is an end-of-file, then continuing from step (c), otherwise continuing from step (b4);
(b4) if the cell entry introduces a new cell, then continuing from step (b7), otherwise continuing from step (b5);
(b5) if the selected option switch is the "changes" switch, then continuing from step (b2), otherwise continuing from step (b6);
(b6) inserting the cell entry into the output data structure and continuing from step (b2);
(b7) if the cell entry has a name identical to that of the conditional delay data structure, then continuing from step (b8), otherwise continuing from step (b5); and
(b8) inserting the cell entry and corresponding selected rise/fall data from the conditional delay data structure into the output data structure and continuing from step (b6).

11. The method of claim 10 wherein step (b1) comprises the following steps:
(b1-1) receiving as input a conditional delay string or an end-of-file from the conditional delay specifications file;
(b1-2) if an end-of-file is received, then continuing from step (b2), otherwise continuing from step (b1-3);
(b1-3) if the conditional delay string begins a new cell, then continuing at step (b1-4), otherwise continuing from step (b1-5);
(b1-4) initializing a new conditional delay data structure with the name of the new cell and continue processing from step (b1-1);

(b1-5) searching the conditional delay string for an input condition symbol and inserting the input condition symbol in the new conditional delay data structure;

(b1-6) parsing a subsequent two substrings in the conditional delay string respectively as an input pin name and an output pin name for a conditional input/output path;

(b1-7) storing the input pin name and the output pin name in the new conditional delay data structure;

(b1-8) parsing a subsequent two substrings in the conditional delay string respectively as a rise time and a fall time; and (b1-9) storing the rise time and the fall time in the new conditional delay data structure and continuing processing from step (b1-1).

12. The computer program product of claim 11 wherein step (b8) comprises the following steps:

(b8-1) receiving as input a line from the cell entry;

(b8-2) if the line from the cell entry contains timing information, then continuing from step (b8-5), otherwise continuing from step (b8-3);

(b8-3) if the line from the cell entry is a last line of the cell entry, then continuing from step (b6), otherwise continuing from step (b8-4);

(b8-4) inserting the cell entry into the output data structure and continuing from step (b8-1);

(b8-5) if a pin pair from the line from the cell entry is identical to a pin pair in the conditional delay data structure, then continuing from step (b8-6), otherwise continuing from step (b8-3);

(b8-6) inserting an output condition from the conditional delay data structure and the pin pair from the line from the cell entry into the output data structure;

(b8-7) parsing timing data for minimum, maximum, and typical delay values from the main input file for the cell entry;

(b8-8) if a rise time for the cell entry is specified in the conditional delay specifications file as a minimum delay, then continuing from step (b8-12), otherwise continuing from step (b8-9);

(b8-9) if the rise time for the cell entry is specified in the conditional delay specifications file as a maximum delay, then continuing from step (b8-10), otherwise continuing from step (b8-11);

(b8-10) selecting a largest delay time for the cell entry from the main input file and continuing from step (b8-13);

(b8-11) selecting an average delay time for the cell entry from the main input file and continuing from step (b8-13);

(b8-12) selecting a smallest delay time for the cell entry from the main input file;

(b8-13) if a fall time for the cell entry is specified in the conditional delay specifications file as a minimum delay, then continuing from step (b8-17), otherwise continuing from step (b8-14);

(b8-14) if the fall time for the cell entry is specified in the conditional delay specifications file as a maximum delay, then continuing from step (b8-15), otherwise continuing from step (b8-16);

(b8-15) selecting a largest delay time for the cell entry from the main input file and continuing from step (b8-18);

(b8-16) selecting an average delay time for the cell entry from the main input file and continuing from step (b8-18)

(b8-17) selecting a smallest delay time for the cell entry from the main input file; and (b8-18) inserting the selected delay time for the cell entry from the main input file into the output data structure and continuing from step (b8-1).

13. The computer program product of claim 7 wherein the computer program is a script written in a programming language.

14. The computer program product of claim 13 wherein the programming language is Practical Extraction and Report Language (PERL).

* * * * *